US012706152B2

(12) United States Patent
Yang et al.

(10) Patent No.: US 12,706,152 B2
(45) Date of Patent: Aug. 11, 2026

(54) FULL SEQUENCE PROGRAM FOR EDGE WORD LINE QUAD-LEVEL MEMORY CELLS

(71) Applicant: Sandisk Technologies, Inc., Milpitas, CA (US)

(72) Inventors: Sisi Yang, Campbell, CA (US); Yanjie Wang, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 200 days.

(21) Appl. No.: 18/227,175

(22) Filed: Jul. 27, 2023

(65) Prior Publication Data

US 2024/0363167 A1 Oct. 31, 2024

Related U.S. Application Data

(60) Provisional application No. 63/462,066, filed on Apr. 26, 2023.

(51) Int. Cl.

*G11C 16/10* (2006.01)
*G11C 16/04* (2006.01)
*G11C 16/14* (2006.01)
*G11C 16/34* (2006.01)

(52) U.S. Cl.

CPC ........ *G11C 16/102* (2013.01); *G11C 16/0433* (2013.01); *G11C 16/14* (2013.01); *G11C 16/3459* (2013.01)

(58) Field of Classification Search

CPC ... G11C 16/102; G11C 16/0433; G11C 16/14; G11C 16/3459

USPC .................................................. 365/189.011

See application file for complete search history.

(56) References Cited

U.S. PATENT DOCUMENTS

| | | | | |
|---|---|---|---|---|
| 7,839,687 | B2 * | 11/2010 | Dutta | G11C 16/3454 365/185.24 |
| 11,468,950 | B1 * | 10/2022 | Prakash | G11C 16/0483 |
| 2022/0415399 | A1 | 12/2022 | Lien et al. | |
| 2023/0342029 | A1 * | 10/2023 | Dong | G06F 3/0653 |

OTHER PUBLICATIONS

U.S. Appl. No. 18/224,477, Hybrid Triple Level Cell Programming Algorithm for on Pitch Scaling in Bit Cost Scalable Memory Apparatuses and Sub-Block Mode, Wei Cao, et al., Jul. 20, 2023.

* cited by examiner

*Primary Examiner* — Alexander Sofocleous
*Assistant Examiner* — Duy H Luong
(74) *Attorney, Agent, or Firm* — Dickinson Wright PLLC

(57) ABSTRACT

A memory apparatus and method of operation are provided. The apparatus includes memory cells each connected to one of a plurality of word lines and disposed in memory holes. The memory cells are configured to retain a threshold voltage corresponding to one of a plurality of data states. A control means is coupled to the plurality of word lines and the memory holes and is configured to program the memory cells in a program operation. During the program operation, the control means programs the memory cells connected to at least one particular word line of the plurality of word lines using a first programming technique while programming the memory cells connected to plurality of word lines other than the at least one particular word line using a second programming technique different than the first programming technique.

20 Claims, 34 Drawing Sheets y
x
701
DL19
702
703
704
DL19a
DL19b
DL19c
DL19d
BL23
BL22
BL21
BL20
BL19
BL18
BL17
BL16
BL15
BL14
BL13
BL12
BL11
BL10
BL9
BL8
BL7
BL6
BL5
BL4
BL3
BL2
BL1
BL0
710
711
712a
714
715
716
717
718
719

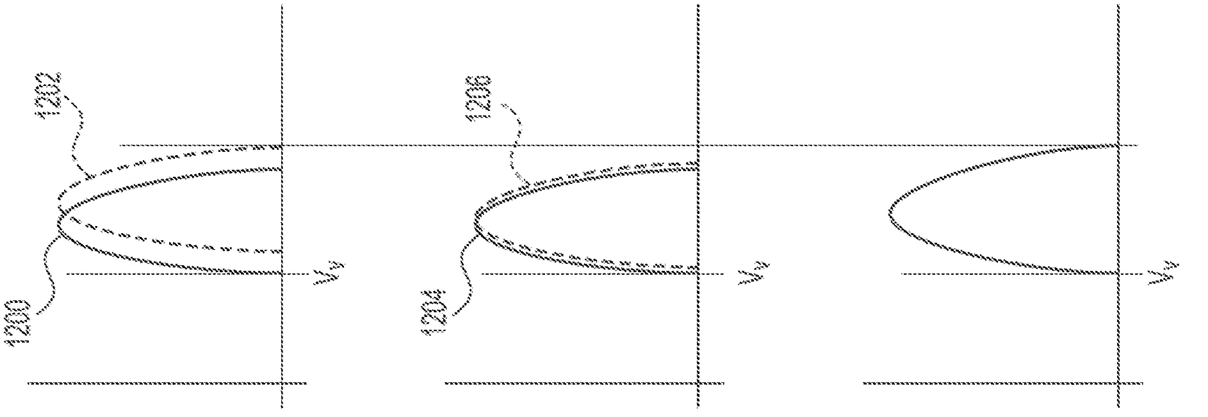
FIG. 12A
FIG. 12B
FIG. 12C
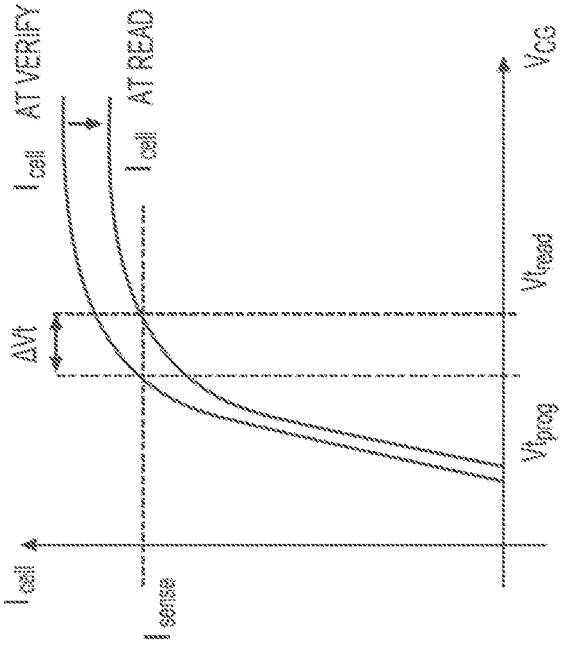
FIG. 11

TO FIG 17 (CONT.)

| WL | COND. | FFSTATUS | AVG(TIME) | AVG(PROGLOOPS) |
|---|---|---|---|---|
| 79 | DEFAULT_FF | FOGGY | 2386 | 22.1 |
| | | FINE | 9870 | 42.2 |
| | JOINT_FINE_ONLY | FOGGY | 2390 | 22.2 |
| | | FINE | 9945 | 42.1 |
| | DIFF. | FOGGY | 4 | 0.1 |
| | | FINE | 75 | -0.1 |
| 80 | DEFAULT_FF | FOGGY | 2344 | 21.9 |
| | | FINE | 10030 | 42 |
| | JOINT_FINE_ONLY | FOGGY | | |
| | | FINE | 10475 | 43.6 |
| | DIFF. | FOGGY | -2344 | -21.9 |
| | | FINE | 445 | 1.6 |
| 81 | DEFAULT_FF | FOGGY | 2430 | 21.9 |
| | | FINE | 7306 | 36.1 |
| | JOINT_FINE_ONLY | FOGGY | 2426 | 21.9 |
| | | FINE | 7315 | 36 |
| | DIFF. | FOGGY | -4 | 0.0 |
| | | FINE | 9 | -0.1 |

FIG. 19

| WL. | COND. | TRIM | S0 UPPER TAIL | S1-S14 | S15 LOWER TAIL | Vt WINDOW |
|---|---|---|---|---|---|---|
| 79 | DEFAULT_FF | TRIM1 | -0.433 | 5.703 | 4.902 | -0.368 |
| | JOINT_FINE_ONLY | TRIM1 | -0.363 | 5.708 | 4.912 | -0.433 |
| | | OPT | -0.398 | 5.541 | 4.938 | -0.206 |
| | DIFF. | TRIM1 | 0.070 | 0.005 | 0.010 | -0.065 |
| | | OPT | 0.035 | -0.162 | 0.035 | 0.162 |
| 80 | DEFAULT_FF | TRIM1 | -0.448 | 5.530 | 4.957 | -0.124 |
| | JOINT_FINE_ONLY | TRIM1 | -0.507 | 5.941 | 4.921 | -0.513 |
| | | OPT | -0.502 | 5.960 | 4.924 | -0.535 |
| | DIFF. | TRIM1 | -0.059 | 0.411 | -0.036 | -0.389 |
| | | OPT | -0.054 | 0.431 | -0.033 | -0.410 |

FIG. 21

| MARGIN CHANGE@PD | | | |
|---|---|---|---|
| COND. | TRIM | 79 | 80 |
| JOINT_FINE_ONLY | TRIM1 | -0.065 | -0.379 |
| | TRIM2 | 0.162 | -0.140 |
| | TRIM3 | 0.183 | -0.396 |
| | TRIM4 | 0.188 | -0.392 |

FIG. 22

| Vt WINDOW | | | | | |
|---|---|---|---|---|---|
| WL | COND. | TRIM | 0Hr | 0Hr | 0Hr |
| 78 | DEFAULT_FF | TRIM1 | -0.238 | -1.707 | 1.469 |
| | JOINT_FINE_ONLY | TRIM1 | -0.248 | -1.720 | 1.472 |
| | | OPT | -0.254 | -1.767 | 1.513 |
| 79 | DEFAULT_FF | TRIM1 | -0.361 | -1.890 | 1.529 |
| | JOINT_FINE_ONLY | TRIM1 | -0.423 | -1.778 | 1.355 |
| | | OPT | -0.172 | -1.740 | 1.568 |
| 80 | DEFAULT_FF | TRIM1 | -0.100 | -1.289 | 1.188 |
| | JOINT_FINE_ONLY | TRIM1 | -0.476 | -1.619 | 1.143 |
| | | OPT | -0.493 | -1.714 | 1.220 |
| 81 | DEFAULT_FF | TRIM1 | 1.243 | -0.407 | 1.650 |
| | JOINT_FINE_ONLY | TRIM1 | 1.282 | -0.378 | 1.660 |
| | | OPT | 1.289 | -0.416 | 1.705 |
| 82 | DEFAULT_FF | TRIM1 | 1.189 | -0.924 | 2.112 |
| | JOINT_FINE_ONLY | TRIM1 | 1.212 | -0.914 | 2.126 |
| | | OPT | 1.208 | -0.938 | 2.145 |

FIG. 23

| STATE WIDTH | | | |
| --- | --- | --- | --- |
| COND. | PCH_DAC | PRE-CHARGE | S0 |
| DEFAULT_FF_AF_79FINE | 0 | 5.4 a.u. | 1.729 |
| JOINT_FINE_ONLY_AF_79FINE | 0 | 5.4 a.u | 1.083 |
| | 16 | 5.8 a.u | 1.781 |
| | 48 | 7.0 a.u. | 1.760 |
| | 80 | 7.4 a.u. | 1.744 |
| | 112 | 8.2 a.u. | 1.746 |
| | 144 | 9.0 a.u. | 1.747 |

*FIG. 25*

| STATE WIDTH | | | | | | |
|---|---|---|---|---|---|---|
| COND. | DEFAULT_FF _AF_79FINE | JOINT_FINE_ONLY_AF_79FINE | | | | |
| DAC | 0 | 0 | 1 | 2 | 4 | 6 |
| PVFY | 7.2 a.u. | 7.2 a.u. | 7.3 a.u. | 7.4 a.u. | 7.6 a.u. | 7.8 a.u. |
| S00 | 1.729 | 1.802 | 1.795 | 1.801 | 1.803 | 1.802 |
| S01 | 0.396 | 0.447 | 0.427 | 0.413 | 0.396 | 0.388 |
| S02 | 0.360 | 0.375 | 0.369 | 0.362 | 0.354 | 0.351 |
| S03 | 0.361 | 0.375 | 0.368 | 0.364 | 0.356 | 0.352 |
| S04 | 0.355 | 0.365 | 0.360 | 0.356 | 0.352 | 0.348 |
| S05 | 0.348 | 0.355 | 0.354 | 0.349 | 0.347 | 0.346 |
| S06 | 0.340 | 0.344 | 0.342 | 0.343 | 0.341 | 0.340 |
| S07 | 0.343 | 0.352 | 0.348 | 0.348 | 0.344 | 0.341 |
| S08 | 0.336 | 0.340 | 0.338 | 0.337 | 0.337 | 0.337 |
| S09 | 0.339 | 0.340 | 0.339 | 0.340 | 0.339 | 0.341 |
| S10 | 0.348 | 0.348 | 0.347 | 0.349 | 0.348 | 0.351 |
| S11 | 0.358 | 0.362 | 0.361 | 0.358 | 0.360 | 0.363 |
| S12 | 0.380 | 0.381 | 0.381 | 0.379 | 0.378 | 0.379 |
| S13 | 0.401 | 0.401 | 0.400 | 0.398 | 0.400 | 0.403 |
| S14 | 0.413 | 0.413 | 0.413 | 0.412 | 0.416 | 0.417 |
| S15 | 0.502 | 0.500 | 0.503 | 0.502 | 0.504 | 0.502 |

FIG. 27

| Vt WINDOW | PD | | | DR | | |
|---|---|---|---|---|---|---|
| WL | 78 | 79 | 80 | 78 | 79 | 80 |
| FF w/BASE TRIM | -0.238 a.u. | -0.361 a.u. | -0.100 a.u. | -1.707 a.u. | -1.890 a.u. | -1.289 a.u. |
| FULL SEQ. w/ PARA.TUNE | -0.254 a.u. | -0.172 a.u. | -0.493 a.u. | -1.767 a.u. | -1.740 a.u. | -1.714 a.u. |

FIG. 28

PROGRAMMING THE MEMORY CELLS IN A PROGRAM OPERATION

2900

DURING THE PROGRAM OPERATION, PROGRAMMING THE MEMORY CELLS CONNECTED TO AT LEAST ONE PARTICULAR WORD LINE OF THE PLURALITY OF WORD LINES USING A FIRST PROGRAMMING TECHNIQUE WHILE PROGRAMMING THE MEMORY CELLS CONNECTED TO PLURALITY OF WORD LINES OTHER THAN THE AT LEAST ONE PARTICULAR WORD LINE USING A SECOND PROGRAMMING TECHNIQUE DIFFERENT THAN THE FIRST PROGRAMMING TECHNIQUE

2902

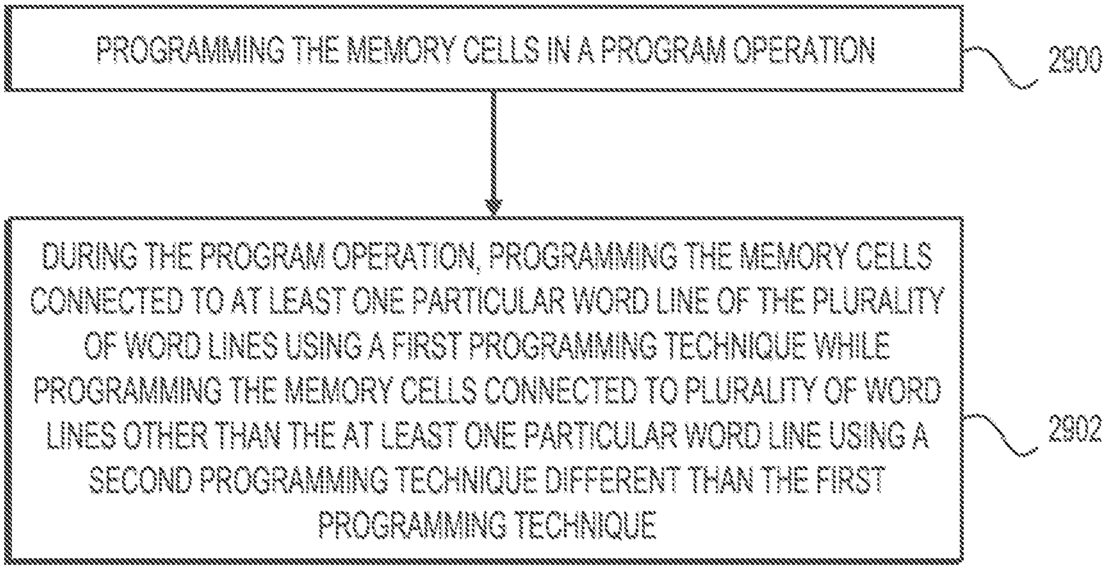

FIG. 29

FULL SEQUENCE PROGRAM FOR EDGE WORD LINE QUAD-LEVEL MEMORY CELLS

CROSS-REFERENCE TO RELATED APPLICATIONS

This application claims the benefit of U.S. Provisional Application No. 63/462,066, filed on Apr. 26, 2023. The entire disclosure of the application referenced above is incorporated herein by reference.

FIELD

This application relates to non-volatile memory apparatuses and the operation of non-volatile memory apparatuses.

BACKGROUND

Many memory devices are provided as internal, semiconductor, integrated circuits in computers or other electronic devices. There are many different types of memory, including random-access memory (RAM), read only memory (ROM), dynamic random-access memory (DRAM), synchronous dynamic random-access memory (SDRAM), an electrically erasable programmable read-only memory (EEPROM), a flash memory, and/or the like. In an EEPROM or flash NAND array architecture, memory cells may be arranged in a matrix of rows and columns such that gates of each memory cell are coupled by rows to word lines. The memory cells may also be arranged together in strings such that memory cells in a given string are coupled together in series, from source to drain, between a common source line and a common bit line.

In some memory devices, programming certain memory cells can adversely affect data in neighboring memory cells. Such interference can result in data retention losses. Accordingly, there is a need for improved non-volatile memory apparatuses and methods of operation.

SUMMARY

An object of the present disclosure is to provide a memory apparatus and a method of operating the memory apparatus that address and overcome the above-noted shortcomings.

Accordingly, it is an aspect of the present disclosure to provide a memory apparatus including memory cells each connected to one of a plurality of word lines and disposed in memory holes. The memory cells are configured to retain a threshold voltage corresponding to one of a plurality of data states. A control means is coupled to the plurality of word lines and the memory holes and is configured to program the memory cells in a program operation. During the program operation, the control means programs the memory cells connected to at least one particular word line of the plurality of word lines using a first programming technique while programming the memory cells connected to plurality of word lines other than the at least one particular word line using a second programming technique different than the first programming technique.

According to another aspect of the disclosure, a controller in communication with a memory apparatus including memory cells each connected to one of a plurality of word lines and disposed in memory holes. The memory cells are configured to retain a threshold voltage corresponding to one of a plurality of data states. The controller is configured to instruct the memory apparatus to program the memory cells in a program operation. During the program operation, the controller is also configured to instruct the memory apparatus to program the memory cells connected to at least one particular word line of the plurality of word lines using a first programming technique while programming the memory cells connected to plurality of word lines other than the at least one particular word line using a second programming technique different than the first programming technique.

According to an additional aspect of the disclosure, a method of operating a memory apparatus is provided. The memory apparatus includes memory cells each connected to one of a plurality of word lines and disposed in memory holes. The memory cells are configured to retain a threshold voltage corresponding to one of a plurality of data states. The method includes the step of programming the memory cells in a program operation. The method also includes the step of during the program operation, programming the memory cells connected to at least one particular word line of the plurality of word lines using a first programming technique while programming the memory cells connected to plurality of word lines other than the at least one particular word line using a second programming technique different than the first programming technique.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 11 illustrates a plot of current vs. voltage for a memory cell during a verify operation and a read operation according to aspects of the disclosure;

FIG. 12A illustrates a plot of a voltage threshold distribution of a programmed data state of a lower word line both after programming and after other word lines have been programmed according to aspects of the disclosure;

FIG. 12B illustrates a plot of a voltage threshold distribution of a programmed data state of an upper word line both before and after other word lines have been programmed according to aspects of the disclosure;

FIG. 12C illustrates a plot of a total voltage threshold distribution of the memory cells among all the word lines for a programmed data state after all of the word lines of the string have completed programming according to aspects of the disclosure;

FIG. 19 is a table of the foggy-fine states, average time and average program loops using a foggy-fine program technique, a full sequence program technique in which the edge word line is programmed directly to fine, along with a difference between the two techniques for multiple word lines according to aspects of the disclosure;

Figure 24:
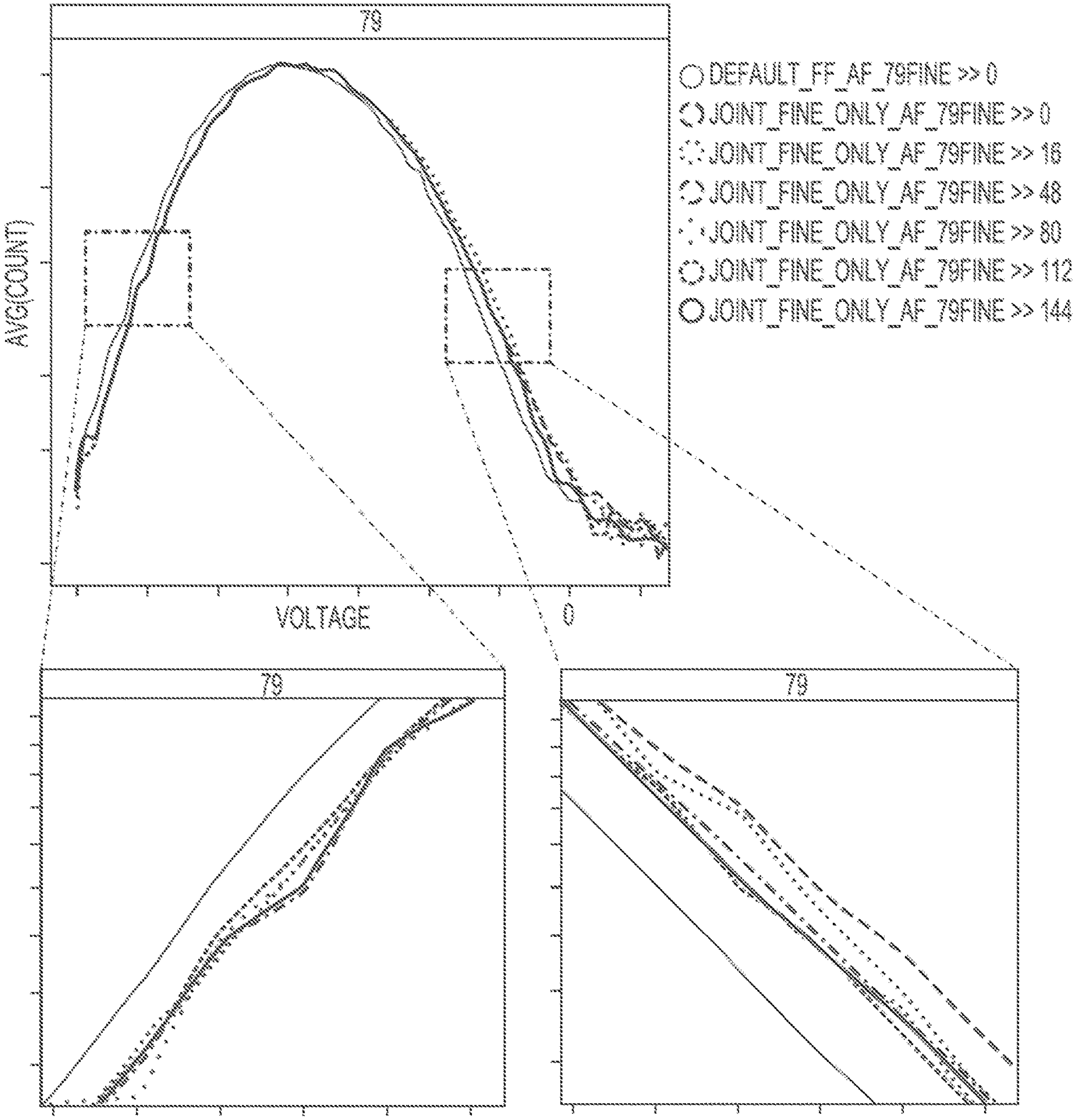
Figure 26:
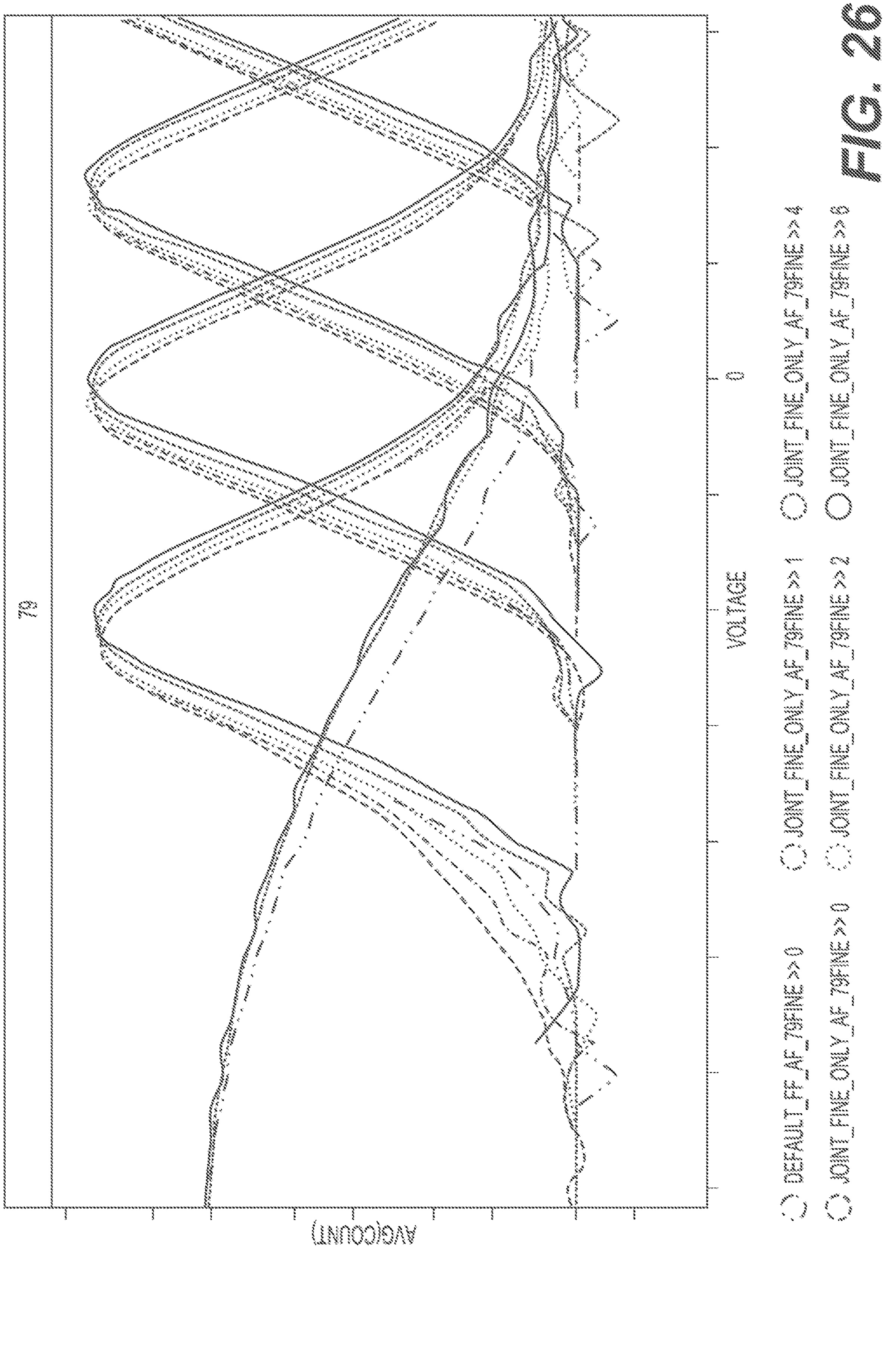

FIG. 21 is a table of an S0 data state upper tail, S1-S14 data states, a S15 data state lower tail, and threshold voltage window using the foggy-fine program technique, the full sequence program technique in which the edge word line is programmed directly to fine, along with the difference between the two techniques for the edge word line and neighboring word line with two different trims according to aspects of the disclosure;

FIG. 22 is a table of a margin change for the edge word line and neighboring word line using various pre-charge voltages and program-verify (PVFY) voltages according to aspects of the disclosure;

FIG. 23 is a table of a threshold voltage window using the foggy-fine program technique and the full sequence program technique in which the edge word line is programmed directly to fine for various word lines after high temperature data retention (HTDR) with two different trims according to aspects of the disclosure;

FIG. 24 shows a plot of a threshold voltage of memory cells for the S0 data state along with two portions in detail for various pre-charge voltages applied to the edge word line during the neighboring word line pre-charge according to aspects of the disclosure;

FIG. 25 is a table of the state width of the S0 data state using the foggy-fine program technique and the full sequence program technique for the neighboring word line with various pre-charge voltages applied to the edge word line during the neighboring word line pre-charge according to aspects of the disclosure;

FIG. 26 shows a plot of a threshold voltage of memory cells for the multiple data states for various PVFY voltages applied to the edge word line during the neighboring word line program-verify according to aspects of the disclosure;

FIG. 27 is a table of the state width of the plurality of data states using the foggy-fine program technique and the full sequence program technique for the neighboring word line with various PVFY voltages applied to the edge word line during the neighboring word line program-verify according to aspects of the disclosure;

FIG. 28 is a table of program disturb (PD) and data retention (DR) for multiple word lines using the foggy-fine program technique and the full sequence program technique in which the edge word line is programmed directly to fine along with the tuning or adjusting the parameters affecting voltages applied to the at least one edge word line according to aspects of the disclosure; and FIG. 29 illustrates steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side select gate SG transistors (SGD transistors), on a drain-side of the NAND string which is connected to a bit line, and one or more source-side select gate SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge-trapping layer.

Each memory cell may be associated with a data state according to write data in a program command. Based on its data state, a memory cell will either remain in the erased state or be programmed to a programmed data state. For example, in a three bit per cell memory device, there are eight data states including the erased state and the programmed state.

During a program operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming pulses until the programming is completed. Next, a second word line, WL1, is programmed using one or more programming pulses until the programming is completed, and so forth. A programming pulse may include a set of increasing program voltages which are applied to the word line in respective program loops or program-verify iterations. Verify operations or stages may be performed after each program voltage to determine whether the memory cells have completed programming. When programming is completed for a memory cell, it can be inhibited from further programming while programming continues for other memory cells in subsequent program loops.

To counter back-pattern effects a state dependent VPVD voltage is applied to the control gates of a plurality of non-programmed word lines in a string. This has been found to improve threshold voltage distributions across NAND strings regardless of whether a normal programming order (from source side to drain side) or a reverse programming order (from drain side to source side) is employed and also regardless of the number of bits stored in the multi-bit per cell memory cells (e.g., MLC, TLC, QLC, or PLC). However, when VPVD is used for QLC (quad-level memory cells) using a foggy-fine program technique, for example, some difficulties may be encountered.

Figure 1A:
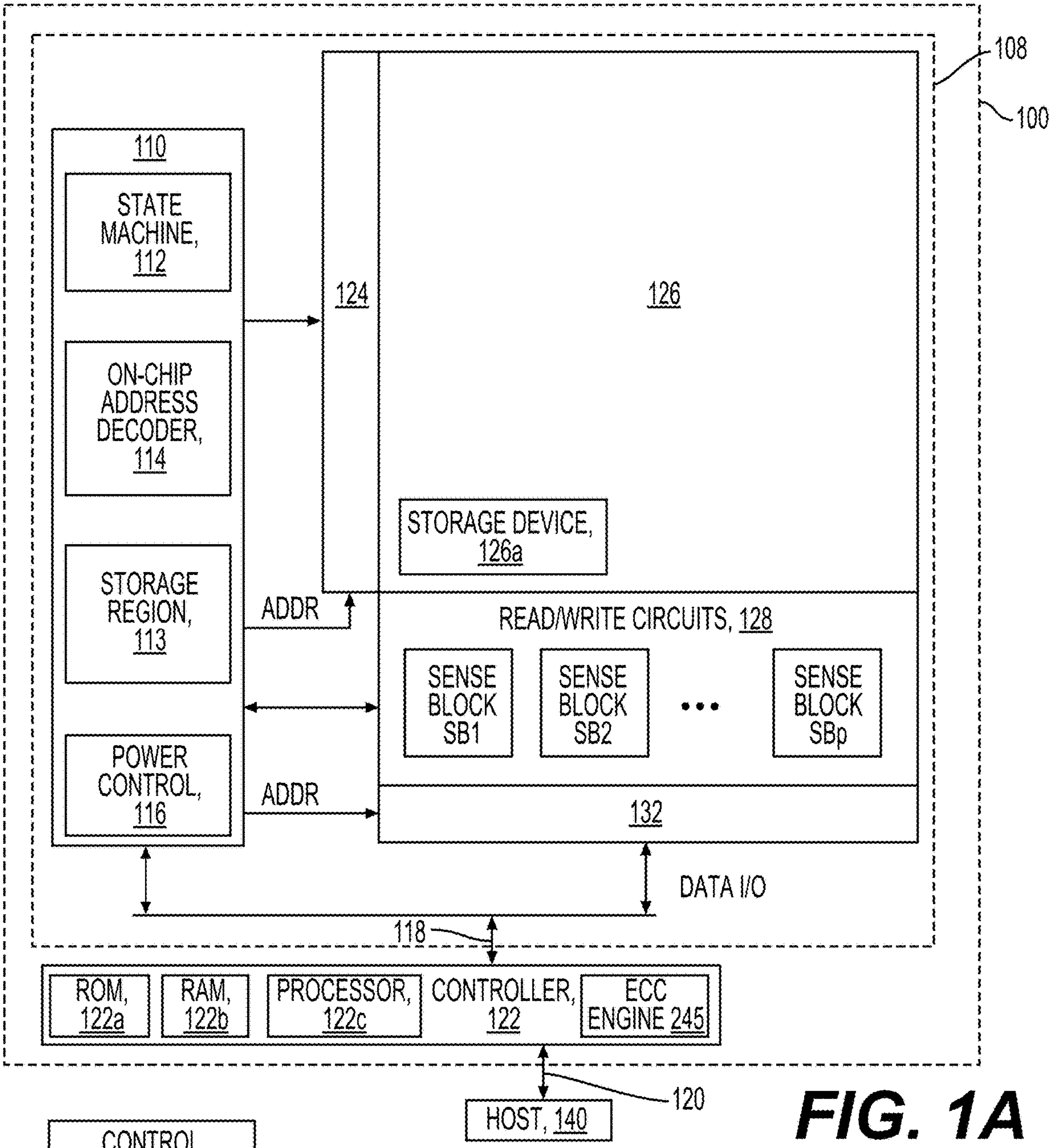
FIG. 1A is a block diagram of an example memory device according to aspects of the disclosure.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

Figure 1B:
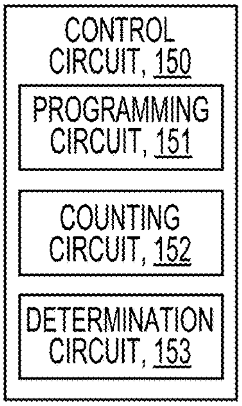
FIG. 1B is a block diagram of an example control circuit according to aspects of the disclosure.

For example, FIG. 1B is a block diagram of an example control circuit 150 which comprises a programming circuit 151, a counting circuit 152, and a determination circuit 153.

The off-chip controller 122 may comprise a processor 122*c*, storage devices (memory) such as ROM 122*a* and RAM 122*b* and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122*a*, 122*b* comprise, code such as a set of instructions, and the processor 122*c* is operable to execute the set of instructions to provide the functionality described herein. Alternately or additionally, the processor 122*c* can access code from a storage device 126*a* of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122*c* fetches the boot code from the ROM 122*a* or storage device 126*a* for execution, and the boot code initializes the system components and loads the control code into the RAM 122*b*. Once the control code is loaded into the RAM 122*b*, it is executed by the processor 122*c*. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x-and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
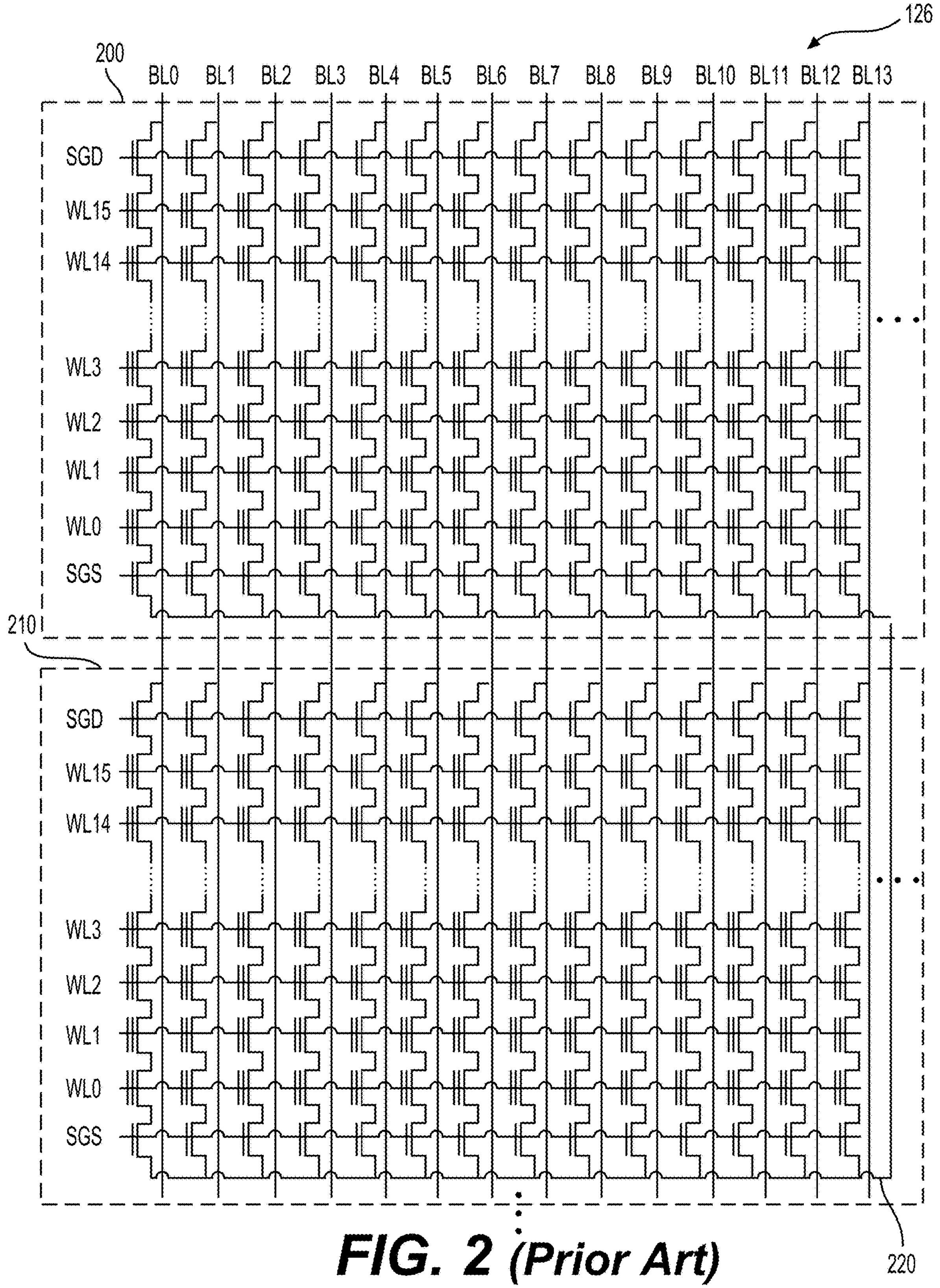
FIG. 2 depicts blocks of memory cells in an example two-dimensional configuration of the memory array of FIG. 1A according to aspects of the disclosure.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory array 126 of FIG. 1A. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 3A:
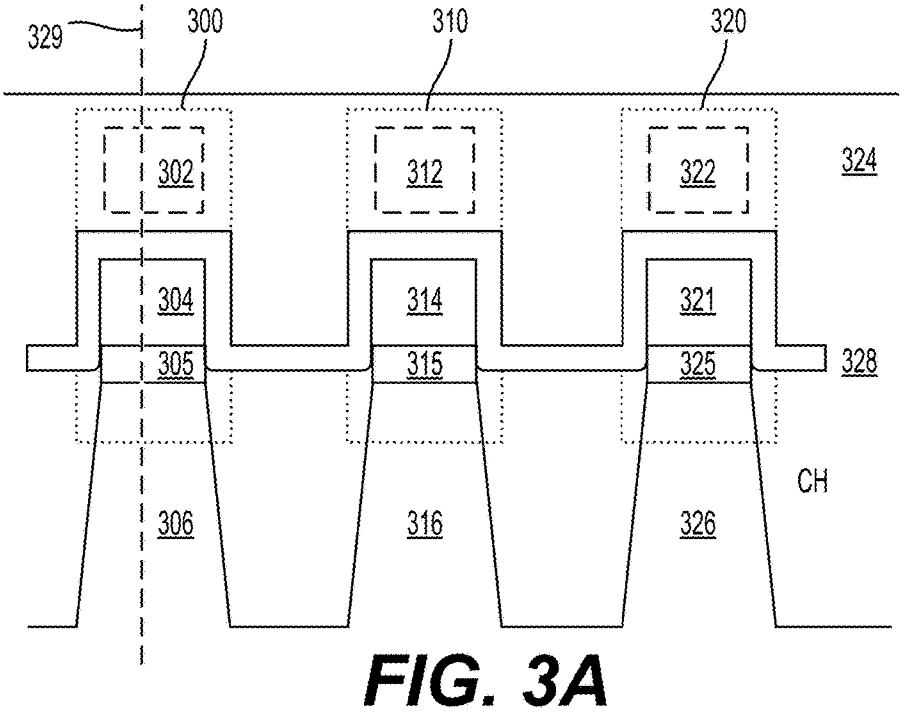
FIG. 3A and FIG. 3B depict cross-sectional views of example floating gate memory cells in NAND strings according to aspects of the disclosure.
Figure 3B:
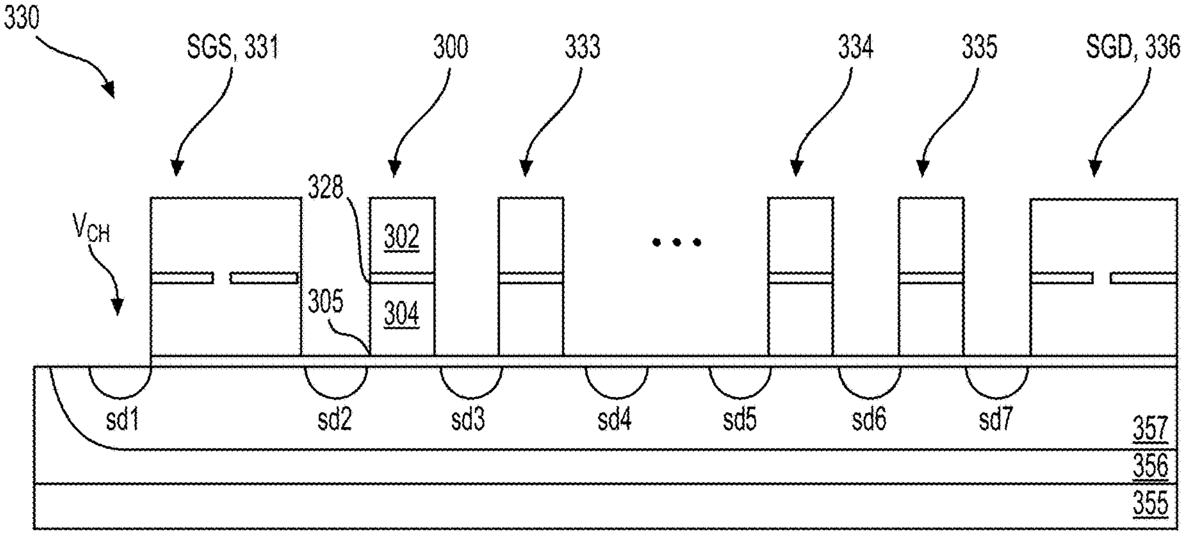

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
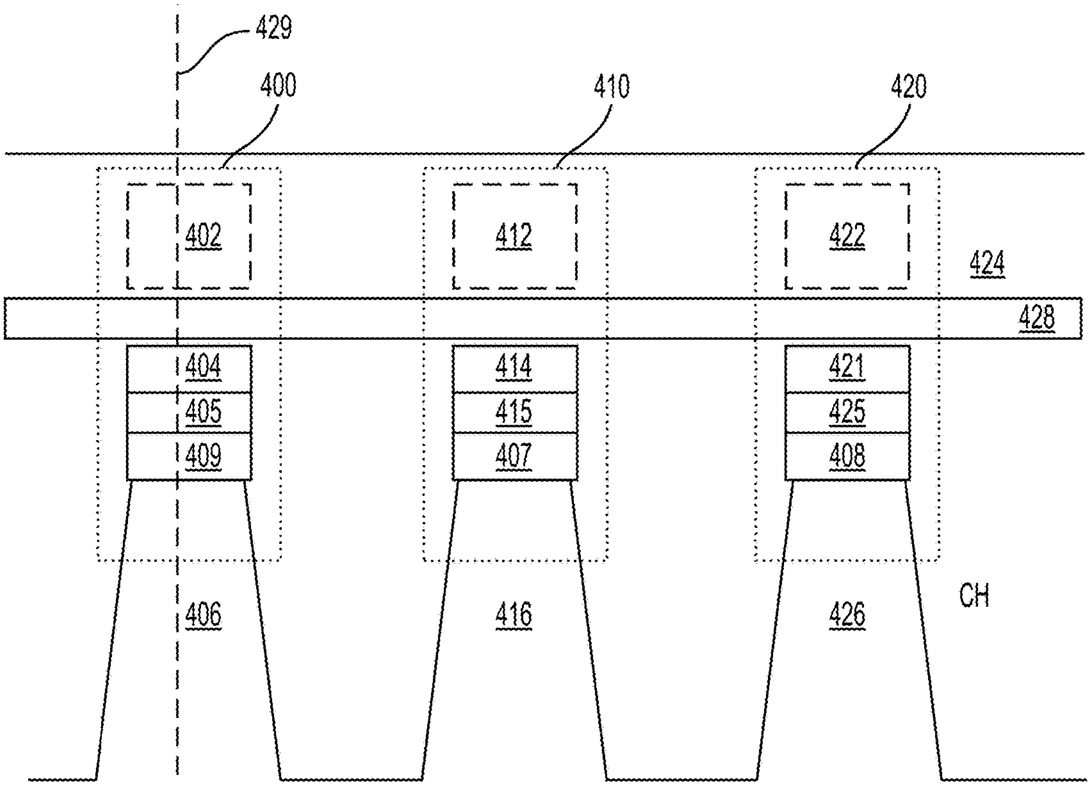
FIG. 4A and FIG. 4B depict cross-sectional views of example charge-trapping memory cells in NAND strings according to aspects of the disclosure.
Figure 4B:
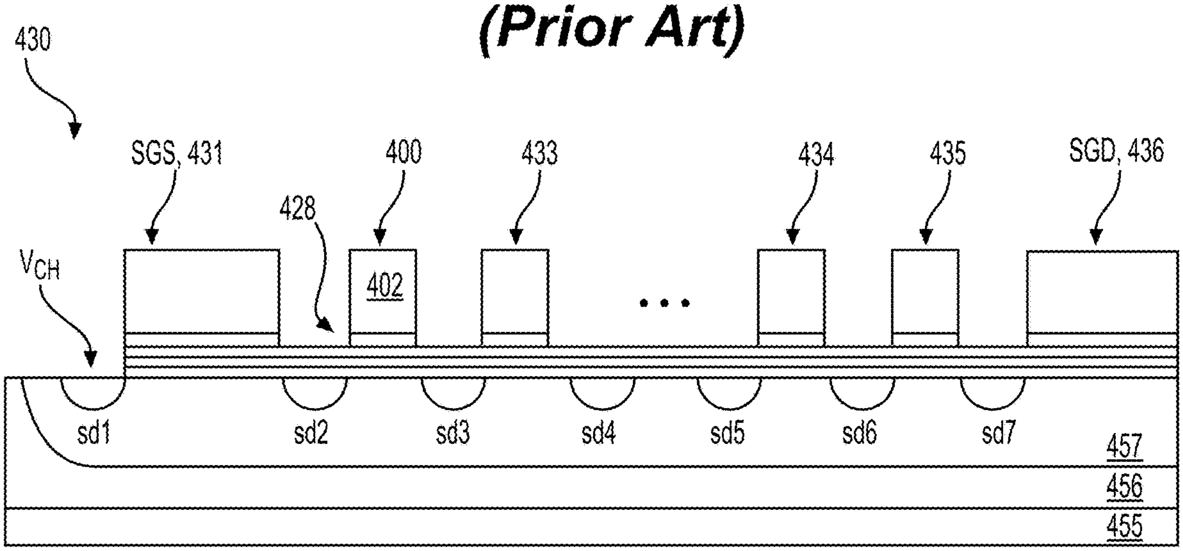

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1A. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
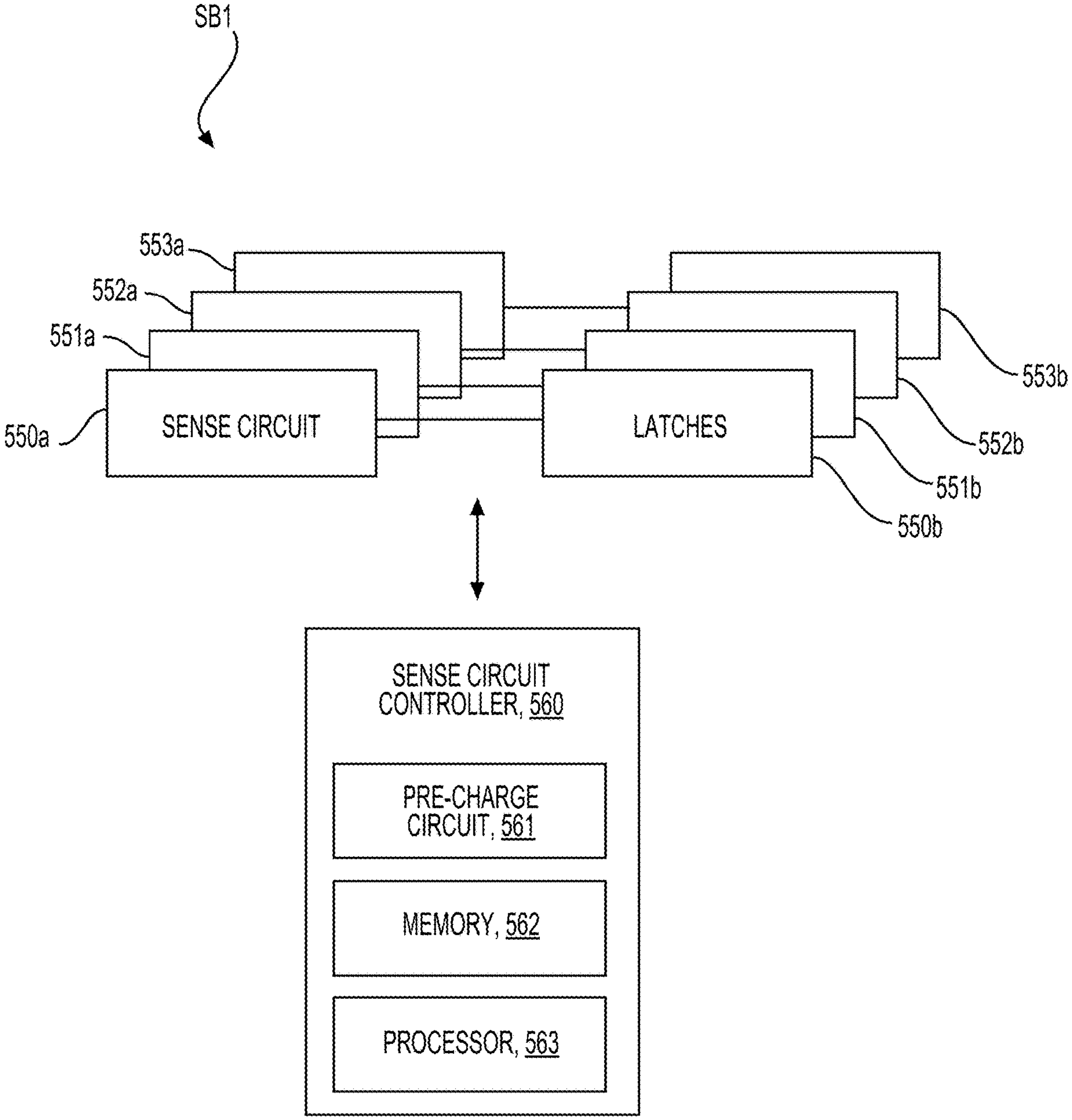
FIG. 5 depicts an example block diagram of the sense block SB1 of FIG. 1A according to aspects of the disclosure.

FIG. 5 illustrates an example block diagram of the sense block SB1 of FIG. 1A. In one approach, a sense block comprises multiple sense circuits. Each sense circuit is associated with data latches. For example, the example sense circuits 550*a*, 551*a*, 552*a*, and 553*a* are associated with the data latches 550*b*, 551*b*, 552*b*, and 553*b*, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550*b*, 551*b*, 552*b*, 553*b* which are associated with the sense circuits 550*a*, 551*a*, 552*a*, 553*a*, setting bit values in the latches and providing voltages for setting pre-charge levels in sense nodes of the sense circuits 550*a*, 551*a*, 552*a*, 553*a*. Further example details of the sense circuit controller 560 and the sense circuits 550*a*, 551*a*, 552*a*, 553*a* are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
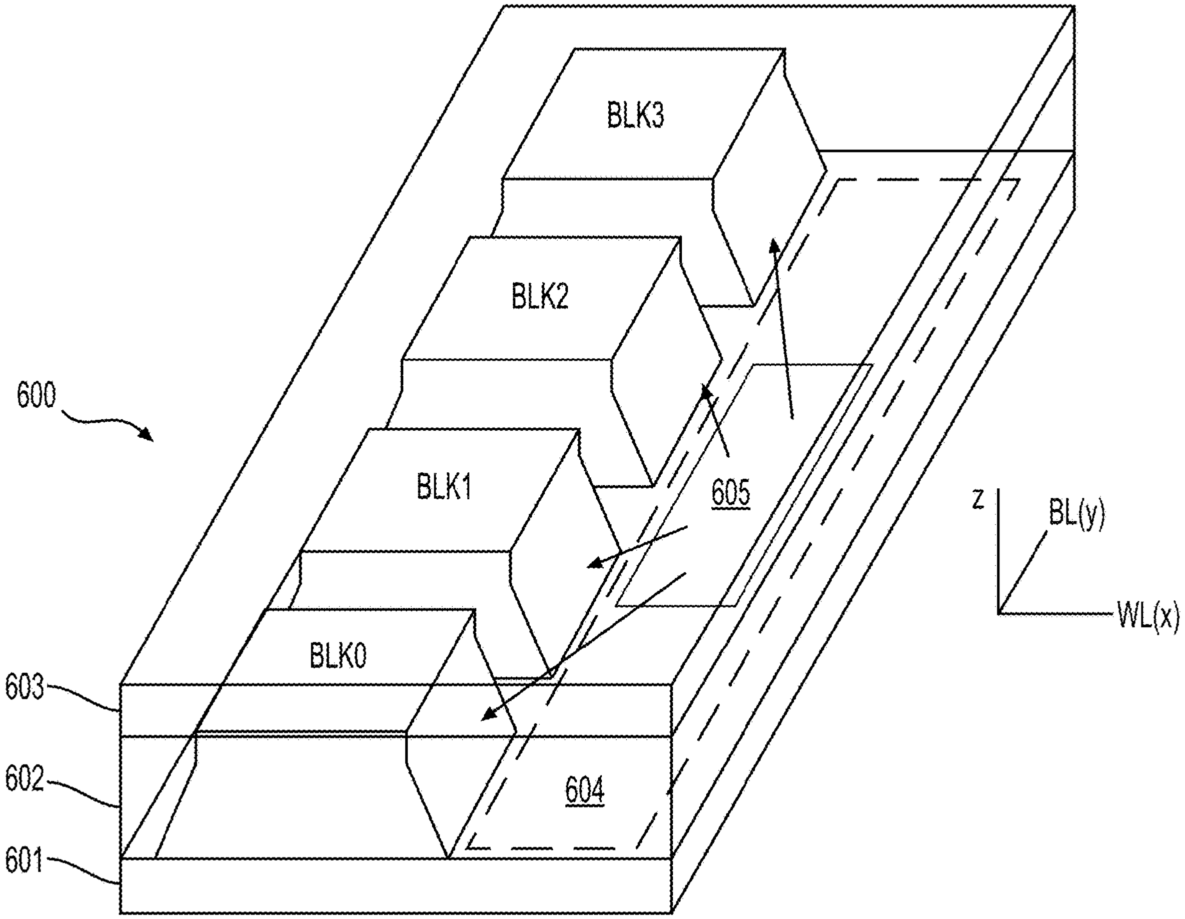
FIG. 6A is a perspective view of a set of blocks in an example three-dimensional configuration of the memory array of FIG. 1A according to aspects of the disclosure.

FIG. 6A is a perspective view of a set of blocks 600 in an example three-dimensional configuration of the memory array 126 of FIG. 1A. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
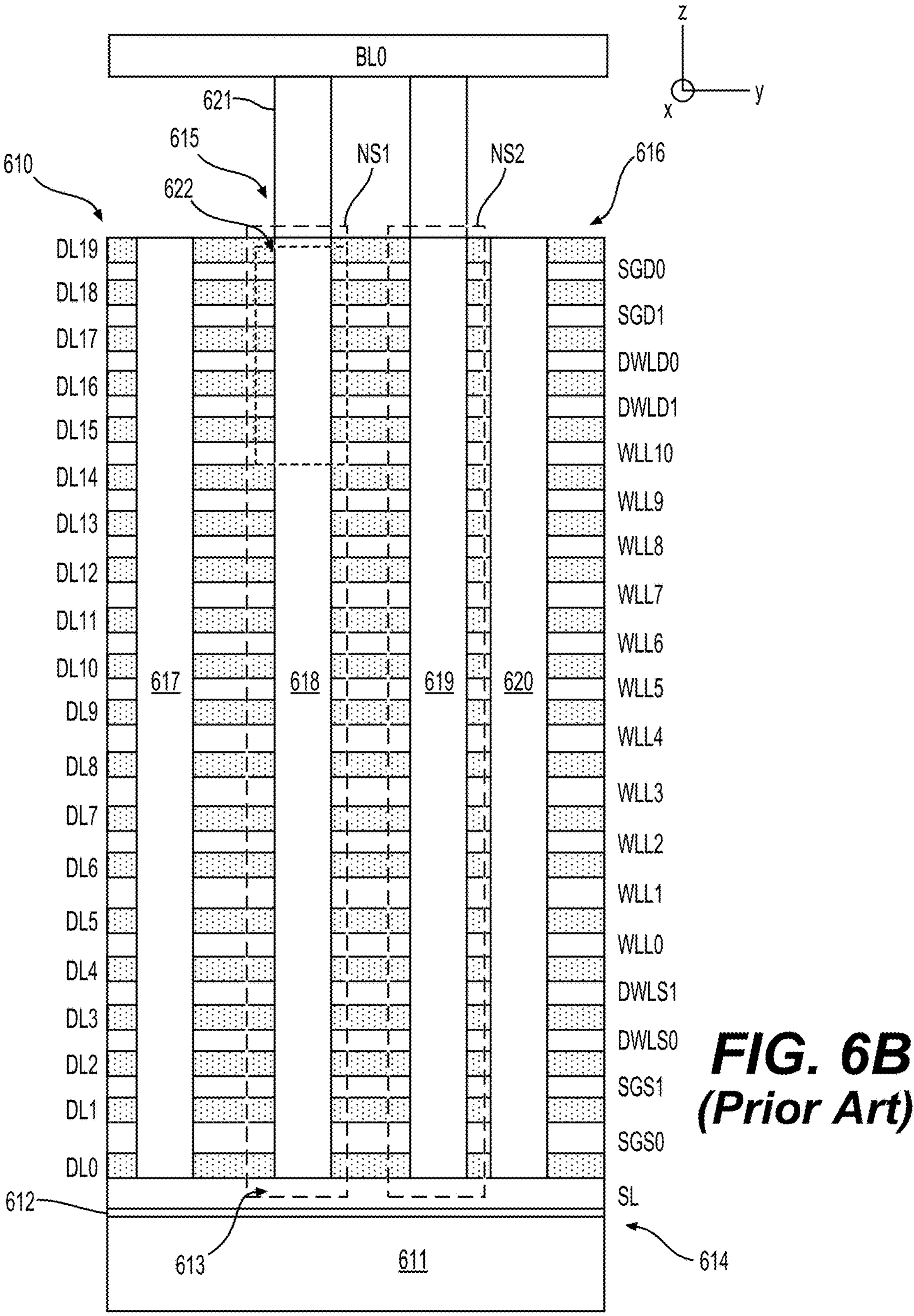
FIG. 6B depicts an example cross-sectional view of a portion of one of the blocks of FIG. 6A according to aspects of the disclosure.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
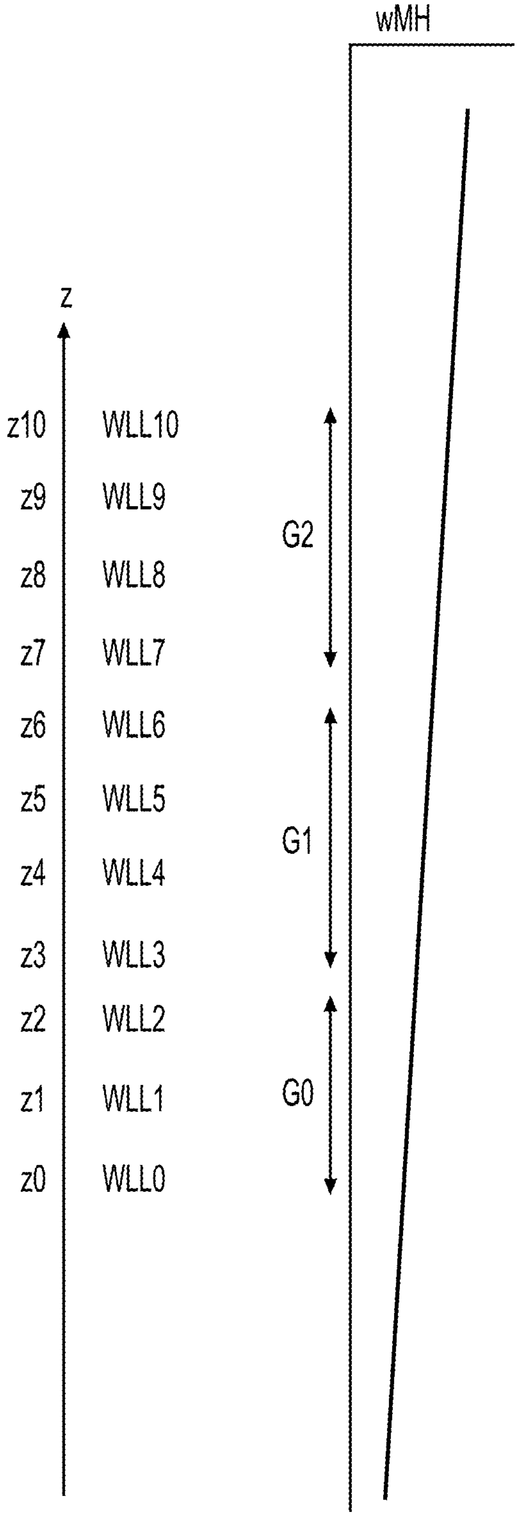
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
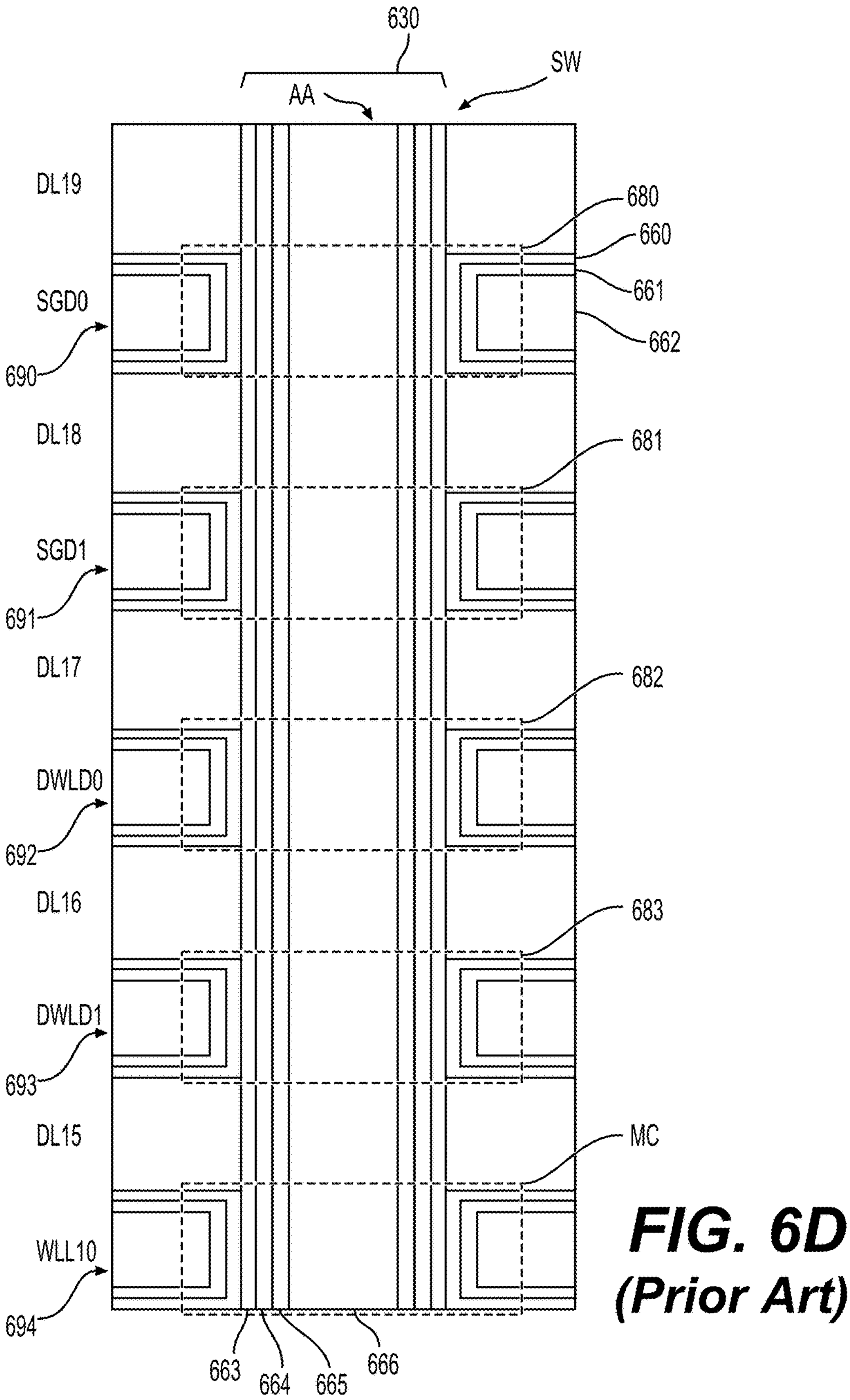
FIG. 6D depicts a close-up view of region 722 of the stack of FIG. 6B according to aspects of the disclosure.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figure 7A:
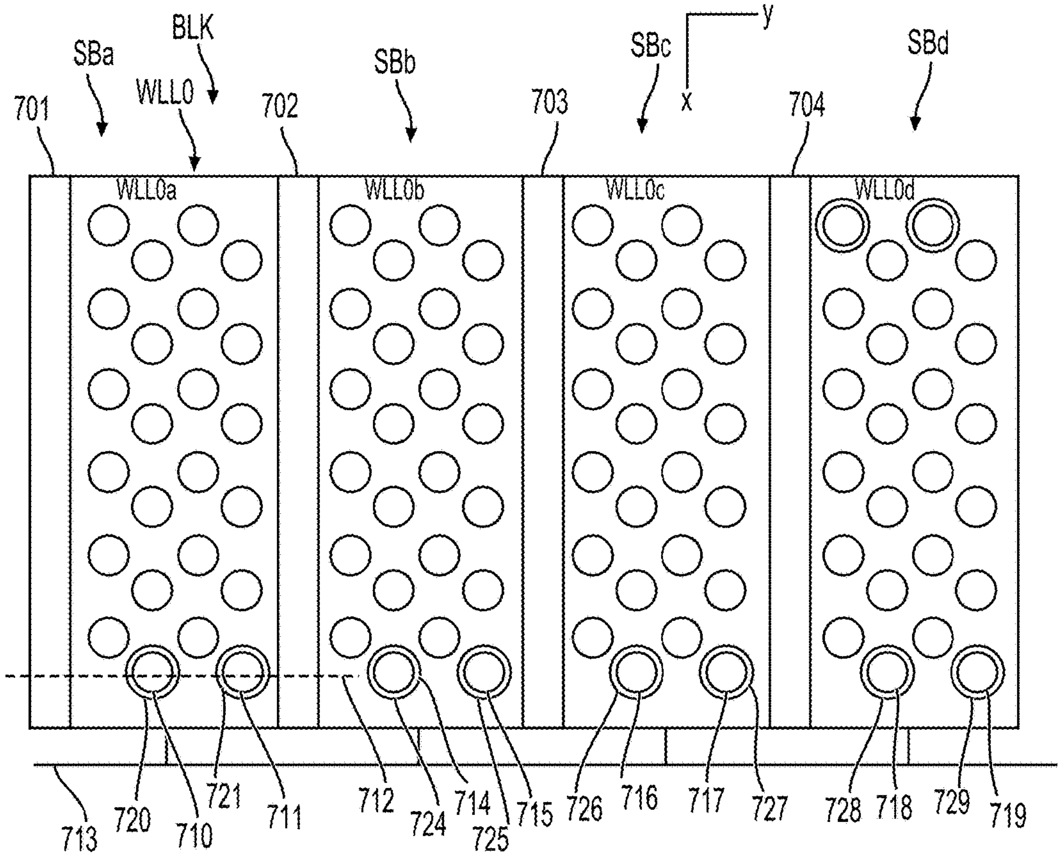
FIG. 7A depicts a top view of an example word line layer WLL0 of the stack of FIG. 6B according to aspects of the disclosure.

FIG. 7A illustrates a top view of an example word line layer WLL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 7B:
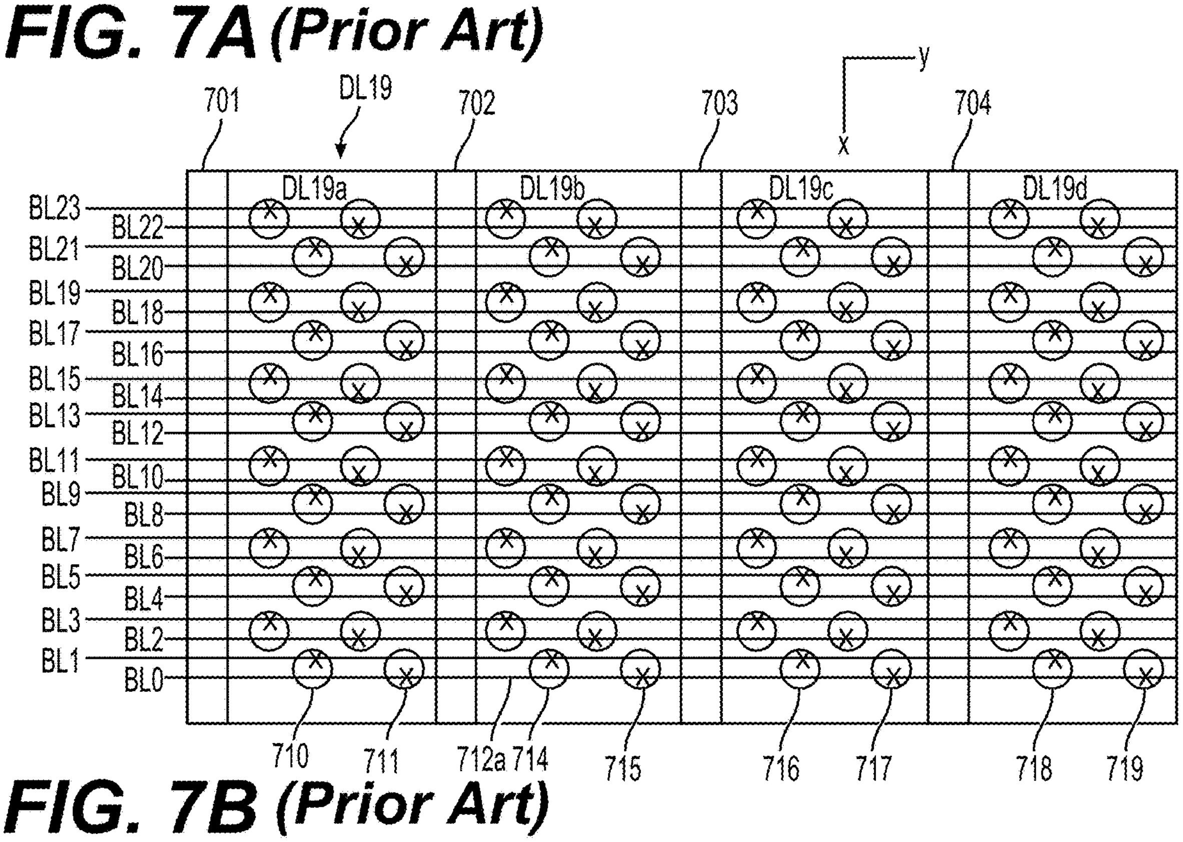
FIG. 7B depicts a top view of an example top dielectric layer DL19 of the stack of FIG. 6B according to aspects of the disclosure.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WLL0*a*, WLL0*b*, WLL0*c* and WLL0*d* which are each connected by a contact line 713. The last region of a word line layer in a block can be connected to a first region of a word line layer in a next block, in one approach. The contact line 713, in turn, is connected to a voltage driver for the word line layer. The region WLL0*a* has example memory holes 710, 711 along a contact line 712. The region WLL0*b* has example memory holes 714, 715. The region WLL0*c* has example memory holes 716, 717. The region WLL0*d* has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 820, 821 are in WLL0*a*, memory cells 824, 825 are in WLL0*b*, memory cells 826, 827 are in WLL0*c*, and memory cells 828, 829 are in WLL0*d*. These memory cells are at a common height in the stack.

Contact line connectors (e.g., slits, such as metal-filled slits) 801, 802, 803, 804 may be located between and adjacent to the edges of the regions WLL0*a*-WLL0*d*. The contact line connectors 801, 802, 803, 804 provide a conductive path from the bottom of the stack to the top of the stack. For example, a source line at the bottom of the stack may be connected to a conductive line above the stack, where the conductive line is connected to a voltage driver in a peripheral region of the memory device.

Figure 8A:
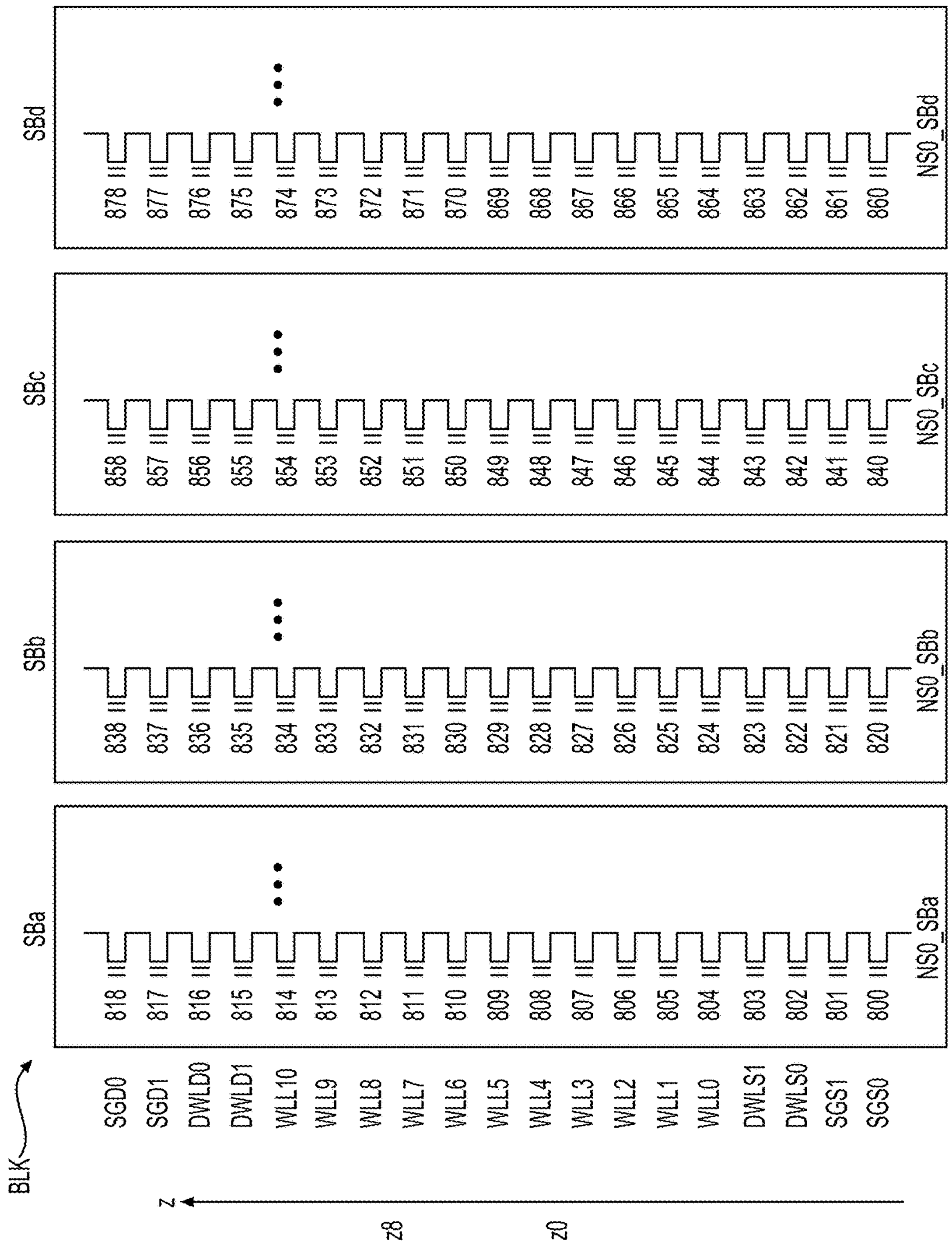
FIG. 8A depicts example NAND strings in the sub-blocks SBa-SBd of FIG. 7A according to aspects of the disclosure.
Figure 8B:
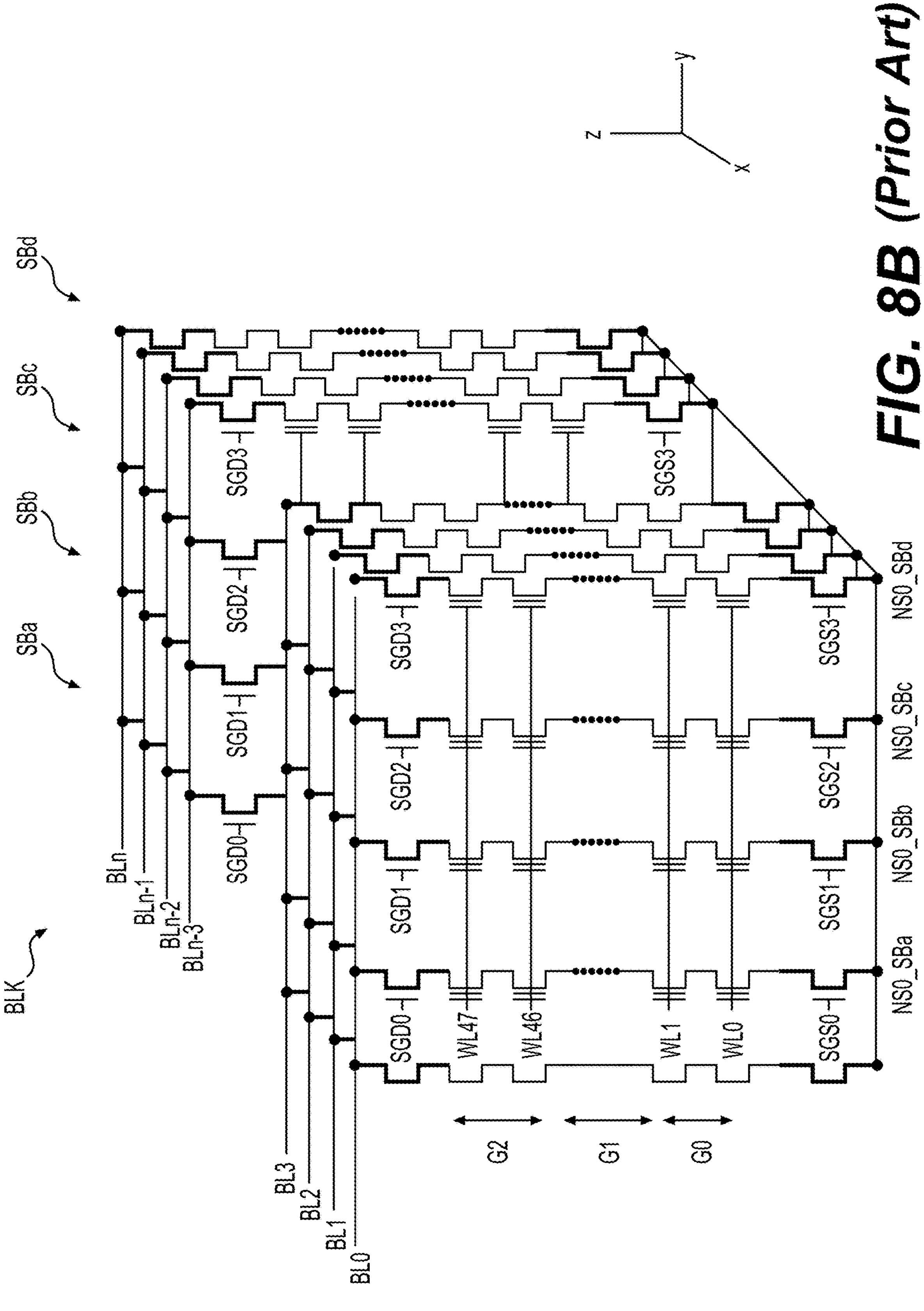
FIG. 8B depicts another example view of NAND strings in sub-blocks according to aspects of the disclosure.

FIG. 8B illustrates a top view of an example top dielectric layer DL19 of the stack of FIG. 7B. The dielectric layer is divided into regions DL19*a*, DL19*b*, DL19*c* and DL19*d*. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL19*a* has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL19 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 10:
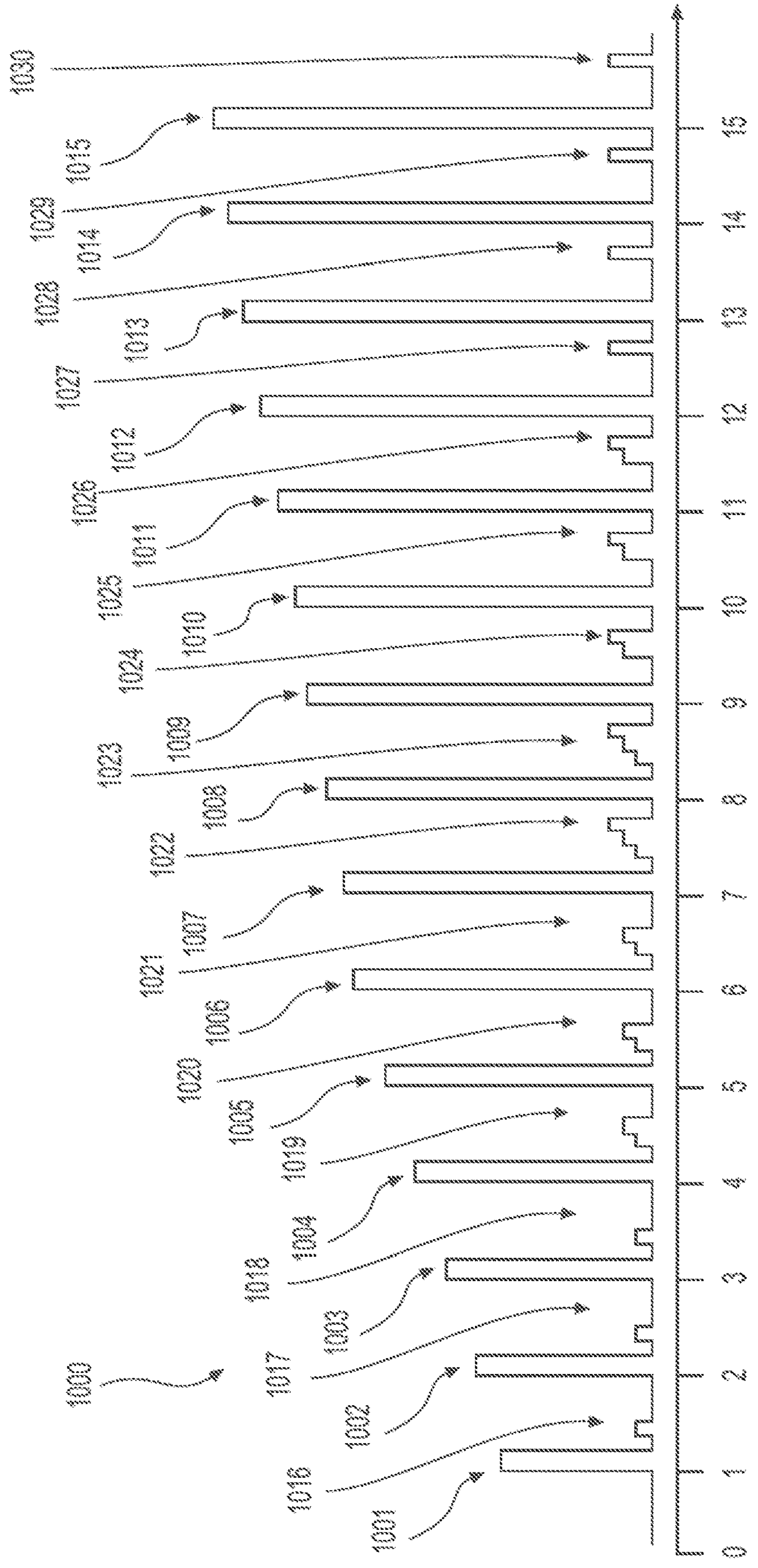
FIG. 10 depicts a plot of voltage applied to the control gate of a selected word line vs. time during an exemplary programming operation according to aspects of the disclosure.

FIG. 10 depicts a waveform 1000 of an example memory cell programming operation that may be employed to detect erratic programming with little or no increase in Tpgm by simultaneously checking both the upper tail of the memory cells of one programmed data state and the lower tail of the memory cells of a next sequential data state. This programming operation could be a full-sequence programming operation or could be one or more passes in a multi-pass programming operation. The horizontal axis depicts time, and the vertical axis depicts control gate or word line voltage applied to a selected word line.

As shown, the pulse train includes multiple program loops or program-verify iterations. Each program loop includes a programming Vpgm pulse which is followed by one or more verify pulses, depending on which data states are being programmed in a particular program loop. A square waveform is depicted for each pulse for simplicity; however, other shapes are possible, such as a multilevel shape or a ramped shape. Further, Incremental Step Pulse Programming (ISPP) is used in this example, in which the Vpgm pulse amplitude steps up in each successive program loop by a fixed amount, e.g., dVpgm. This example uses ISPP in a single programming pass in which the programming is completed. ISPP can also be used in either or both programming passes of a multi-pass operation.

The pulse train includes Vpgm pulses that increase stepwise in amplitude with each program loop using a fixed step size (dVpgm). A new pulse train starts at an initial Vpgm pulse level and ends at a final Vpgm pulse level which does not exceed a maximum allowed level. The pulse train 1000 includes a series of Vpgm pulses 1001-1015 that are applied to a selected word line that includes a set of non-volatile memory cells. One or more verify voltage pulses 1016-1029 are provided after each Vpgm pulse as an example, based on the target data states which are being verified.

The magnitudes of the verify pulses 1016-1029 correspond with both an upper tail of one programmed data state and with the lower tail of a next sequential data state. For the lower tail verify, a memory cell is considered to have failed verify if its Vth is determined to be less than the verify voltage. For the upper tail verify, a memory cell is considered to have passed verify if its Vth is less than the verify voltage and is considered to have failed verify if its Vth is greater than the verify voltage. In contrast, for the lower tail verify, a memory cell is considered to have passed verify if its Vth is greater than the verify voltage and is considered to have failed verify if its Vth is less than the verify voltage.

In each program loop, after the verify pulse or pulses 1016-1029 are completed, a bitscan operation is then performed to count the number of memory cells that have failed each of the simultaneous verifies. For each of the upper tail and lower tail verifies, if the number of memory cells that fail the lower tail verify is less than a predetermined fail bit count (FBC), then the verify operation is determined to have failed. As discussed in further detail below, if the lower tail verify passes, then those memory cells are considered to be fully programmed and are inhibited from further programming while programming continues for the remaining data states until programming of all data states is completed. If the lower tail verify fails, then those memory cells are not inhibited and programming continues with the next programming loop. If the upper tail verify passes, then programming continues until programming of all remaining data states is completed, but if upper tail verify fails, then the entire programming operation is determined to have failed.

Figure 9:
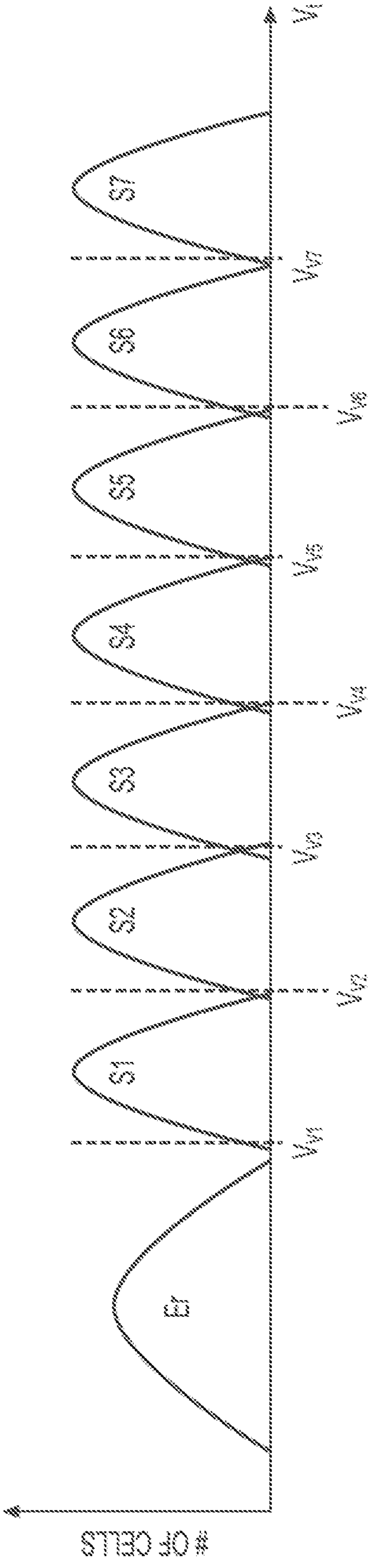
FIG. 9 depicts a plot of voltage threshold distributions in accordance with some embodiments according to aspects of the disclosure.

In the embodiment of FIG. 9, the same single verify voltage is used to simultaneously verify the upper tail of one data state and the lower tail of the next sequential data state. For example, verify voltage Vv1 may be used to verify the upper tail of the erase Er data state and the lower tail of the S1 data state. Similarly, Vv2 may be used to verify the upper tail of the S1 data state and the lower tail of the S2 data state. Continuing on, Vv3 may be used to verify the upper tail of the S2 data state and the lower tail of the S3 data state. This pattern continues up to Vv7, which is used to verify the upper tale of the S6 data state and the lower tail of the S7 data state. In other words, in this example, a particular verify voltage may be selected to simultaneously verify the upper tail of an N-1 data state and the lower tail of an N data state. In some embodiments, verify of the upper tail of the last programmed data state (e.g., data state S7 in TLC) may be skipped.

In NAND memory devices that have long strings that extend through many word lines, unless countermeasures are taken, the conditions of a NAND string may vary as programming proceeds from the word lines nearest a first select line to the word lines nearest a second select line. One phenomenon that has been observed is the back-pattern effect, which refers to an increase in channel resistance of a NAND string as programming progresses through the word lines of the NAND string. More specifically, the channel resistance of a NAND string tends to increase as programming progresses in the NAND string from a source side (e.g., at a bottom end of the NAND string) to a drain side (e.g., at a top end of the NAND string). The opposite may occur if programming commences from the drain side to the source side. In either case, the increase in channel resistance decreases the channel's conductance, which may affect the apparent threshold voltages of the memory cells in the string. This increase in apparent threshold voltages can be significant by the time programming reaches the word lines at the opposite end of where programming started.

To overcome the reduced current, a larger gate voltage may be applied for a selected memory cell to turn on and achieve the same level of channel current as when the channel resistance was lower prior to programming the other word lines of the string. However, this may cause the threshold voltages of the memory cells that are programmed early to shift upward after programming the remaining word lines of the string.

FIG. 12A illustrates the upward shift of memory cells that are programmed early after programming of all of the word lines in a string is completed. Specifically, line 1200 illustrates the Vt distributions of the memory cells of the word lines adjacent where programming begins (e.g., close to the source line), and 1202 illustrates the Vt distributions of those same word lines after programming of all word lines is completed. As shown, during programming of the memory cells of the other word lines, the Vt distribution of the word lines that were programmed early has shifted rightward (higher voltage) by a significant degree.

Turning now to FIG. 12B, the Vt distributions of the memory cells of the word lines adjacent where programming ends both as programmed and after programming are shown with line 1204 illustrating the as-programmed distribution and line 1206 illustrating the after programming is completed distribution. As shown, after programming of the memory cells of the entire NAND string is completed, the Vt distribution has shifted rightward (higher voltage) by a much lesser degree than in FIG. 12A. Because the Vt distributions have shifted by significantly different amounts, as shown in FIG. 12C, the resulting total Vt distribution of one given data state across the entire string is wider than either of the as-programmed distributions. Across multiple data states in a multi-bit per memory cell memory device, this can undesirably increase the Vt window of the memory system.

Various approaches have been utilized to counter the back-pattern effect and also reduce the Vt window across the string. One approach involves applying a lower voltage to the inhibited word lines (i.e., the already programmed word lines) during a verify operation to reduce current during verify. Another approach involves increasing the verify levels of the later programmed word lines to match the Vt upshift of the early programmed word lines. In other words, in this approach, for each programmed data state, the verify voltage that is applied during the later programmed word lines is increased by a biasing voltage as compared to the verify voltage that was applied for the earlier programmed word lines so that the Vt distributions of the early programmed word lines more closely match the Vt distributions of the later programmed word lines.

Figure 13:
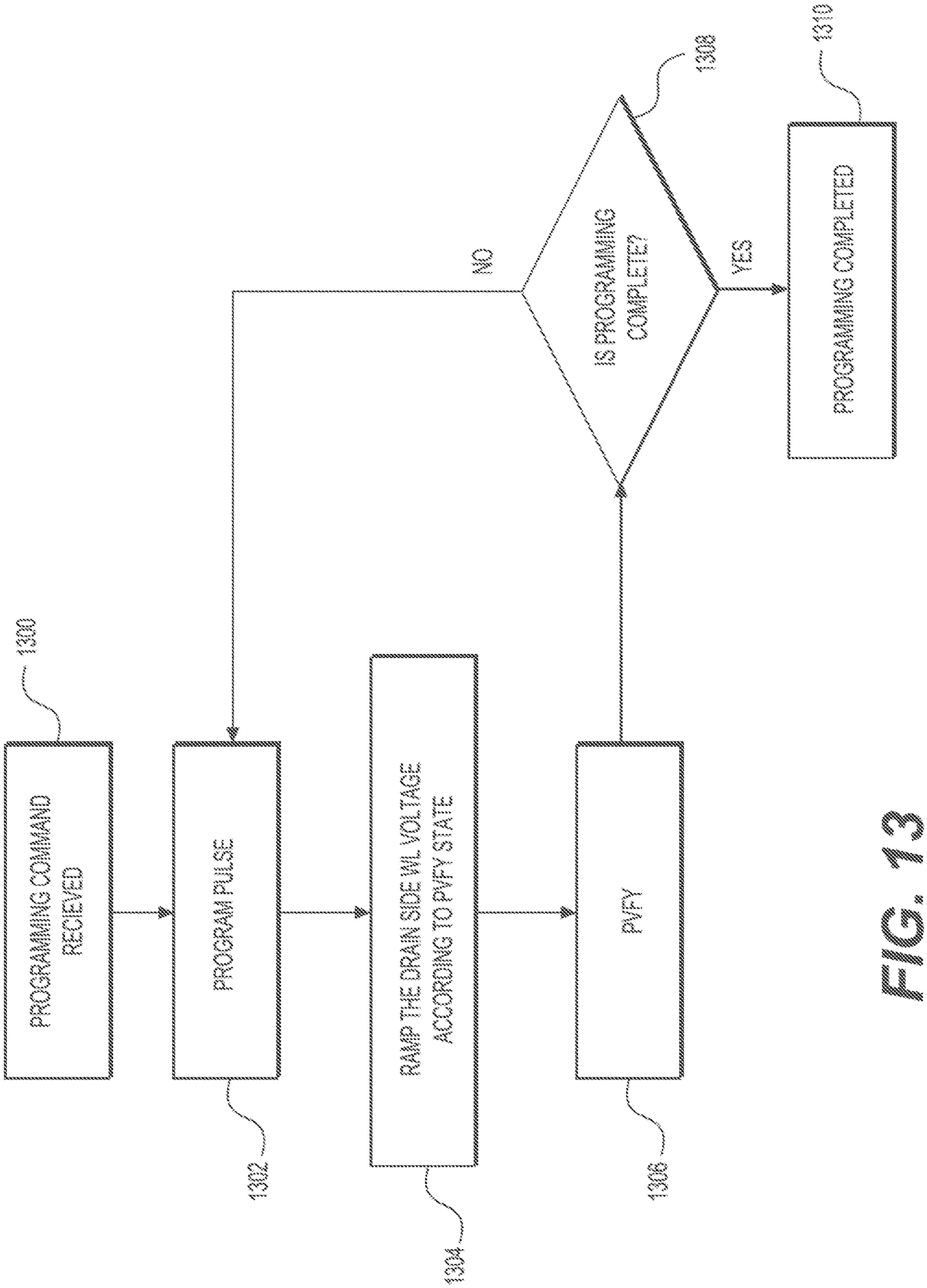
FIG. 13 illustrates a flow chart depicting a programming operation according to aspects of the disclosure.

Referring now to FIG. 13, a flow chart depicting an exemplary verify operation which counters the back-pattern effect while reducing total power usage is generally shown. At step 1300, a programming command is received by the controller of the memory device. At step 1302, a programming pulse is applied to a control gate of the selected word line being programmed to program one or more memory cells while programming of the other word lines of the string is inhibited.

Figure 14:
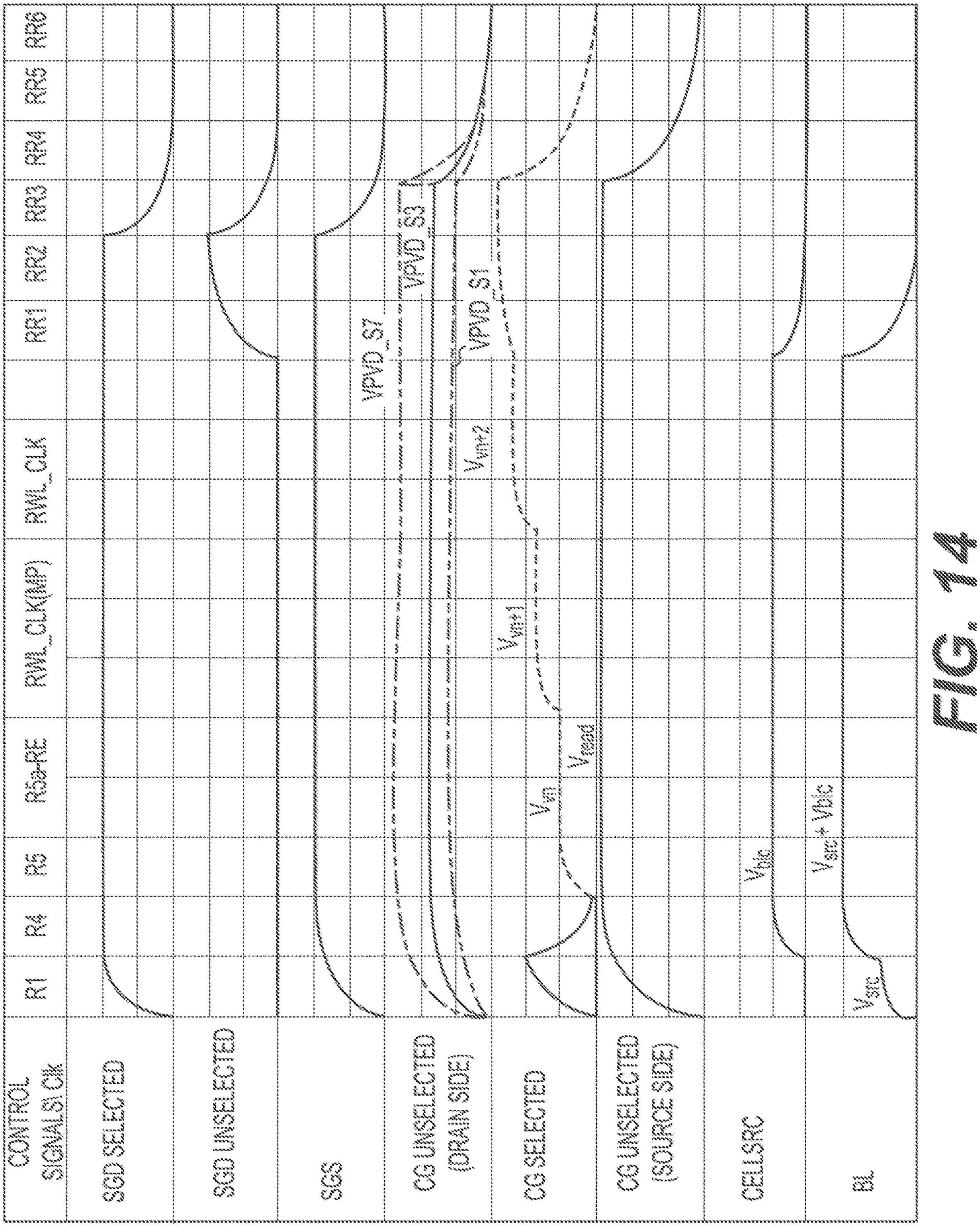
FIG. 14 illustrates the voltages applied to a plurality of components of a memory device during a verify operation according to aspects of the disclosure.

At step 1304, a program verify operation begins. FIG. 14 illustrates the voltages applied to various components of the memory device during the verify operation. At approximately R1 clock (or the R2 clock in some embodiments), simultaneously, the voltages of the control gates of all of the unselected word lines are ramped up. Specifically, the voltages of the word lines on the source side (i.e., the word lines that have been programmed) of the selected word line are ramped from a baseline voltage (e.g., 0 V or Vss) to a Vread voltage, and the voltages of the word lines on the drain side of the selected word line (i.e., the word lines that have not yet been programmed) are ramped up to a VPVD voltage that is dependent on the data state being programmed.

In the exemplary embodiment illustrated in FIG. 14, the control gates of the drain side unselected word lines are ramped to one of a plurality of predetermined and different VPVD voltages with three different VPVD voltages (VPVD_S1, VPVD_S3, and VPVD_S7) being illustrated in the exemplary embodiment. Which of the available VPVD voltages is applied depends on the data state being programmed. In a TLC memory device (example Vt distribution shown in FIG. 9), a VPVD_S1 voltage is employed during programming of data states S1 and S2; a VPVD_S3 voltage is employed during programming of data states S3-S7; and a VPVD_S7 voltage is employed during programming of data state S8. VPVD_S7 is greater than VPVD_S3, which is greater than VPVD_S1. Thus, as programming continues from data state S1 to data state S7, the VPVD voltage applied to the drain side unselected gates increases. In some embodiments, each data state may be associated with a unique VPVD voltage or the VPVD voltages may be attributed to the data states according to a different arrangement. For example, in a QLC memory system, there could be eight VPVD voltages distributed across the fifteen programmed data states or there could be fifteen VPVD voltages so each data state is associated with its own VPVD voltage.

After step 1304 is completed, at step 1306, the control gate of a selected word line is initially ramped up at the R1 or R2 clock in a Vread-spike operation to equalize the potential across the selected word line, as shown in FIG. 14. The selected word line voltage is then ramped back down to a base voltage (e.g., 0 V or Vss) and then progressively increases to one or more verify voltages, such as $Vv_n$, $Vv_{n+1}$, and $Vv_{n+2}$, which correspond to the verify voltages of any three given data states Sn, Sn+1, and Sn+2. In the embodiment of FIG. 14, the voltage applied to the drain side unselected word lines is held constant as the voltage of the selected word lines progressively increases. However, in some embodiments, the drain side selected word line voltage can progressively increase (e.g., from VPVD_S1 to VPVD_S3) along with the increasing voltage of the selected word line so that the VPVD voltage being applied is consistent with the data state being verified at each phase of the verify operation.

The number of memory cells that fail program verify may then be counted in a bitscan operation to determine if programming of the memory cells of the data states being programmed is completed. If so, then those memory cells are inhibited from further programming.

At decision step 1308, it is determined if programming of all of the data states are completed. If the answer at decision step 1308 is yes, then at step 1310, the programming operation is completed. If the answer at decision step 1308 is no, then the method returns to step 1302. Prior to performing step 1302, the magnitude of the programming pulse may be incrementally increased. This process may then be repeated for every word line of the string.

Further, in order to optimize performance, the specific VPVD voltage that is applied may be based on a location of a memory block being programmed within a memory chip or device. For example, during or before program verify for the S1 data state, two bits of data stored in a ROM fuse and a pre-programmed database may be referenced.

Figure 15:
FIG. 15 is a plot of median threshold voltage margin versus physical word line for various temperatures according to aspects of the disclosure.
Figure 16:
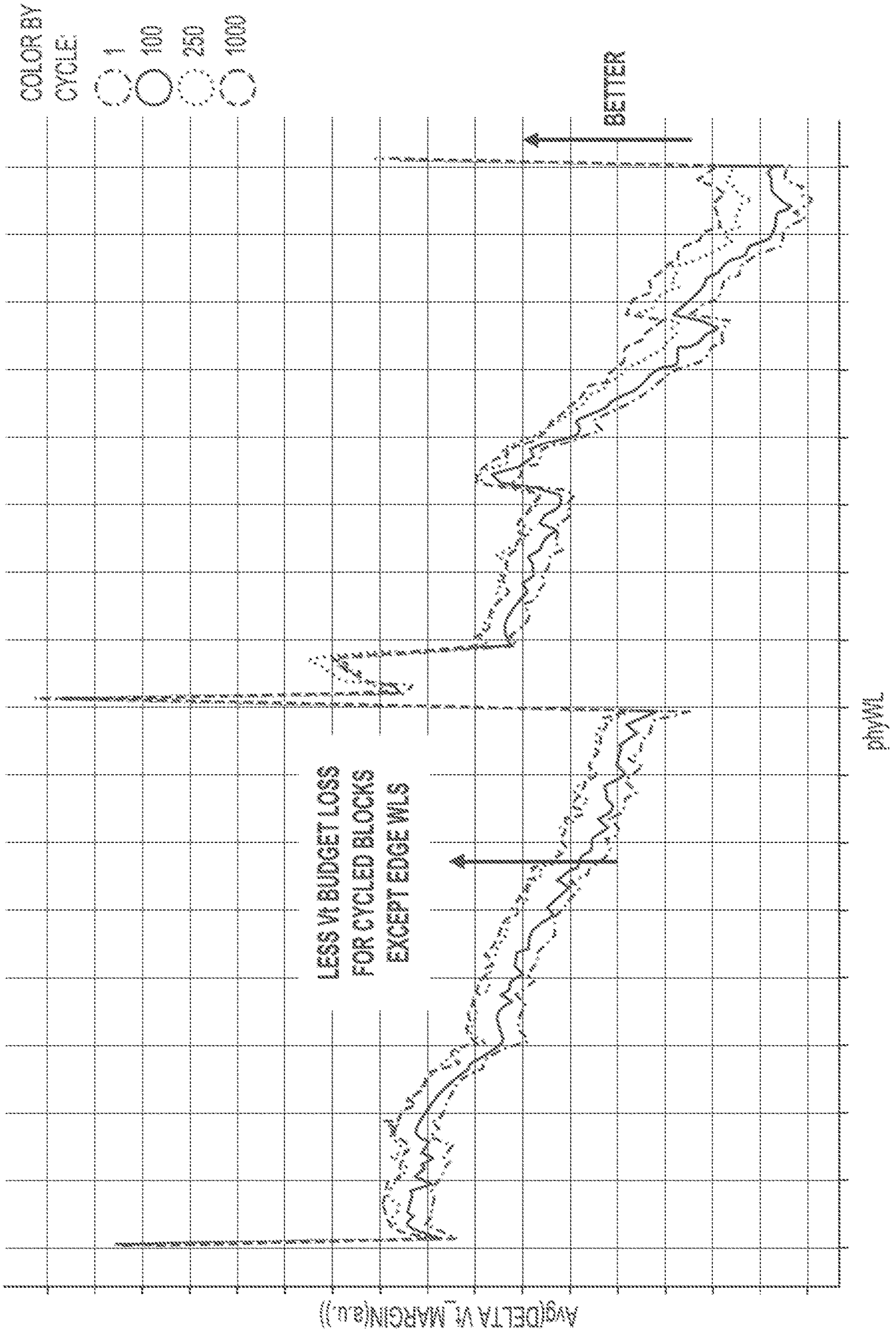
FIG. 16 is a plot of average delta threshold voltage versus physical word line for various amounts of program erase cycling of the memory apparatus according to aspects of the disclosure.
Figure 17:
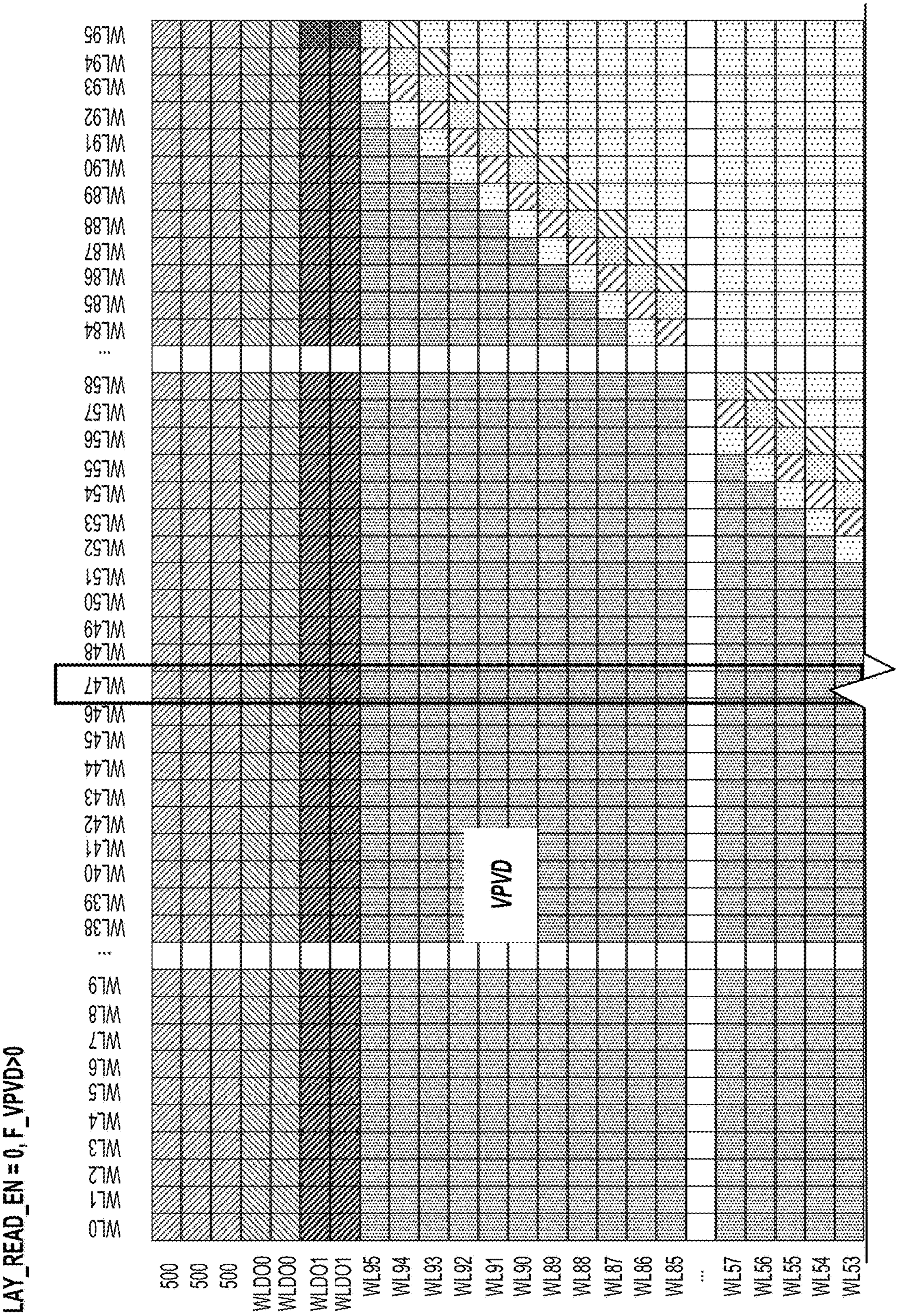
FIG. 17 shows a diagram of a memory apparatus including a stack comprising two tiers including an upper tier arranged vertically above a lower tier and indicating voltage levels applied to the word lines during a program operation using VPVD according to aspects of the disclosure.
Figure 17:
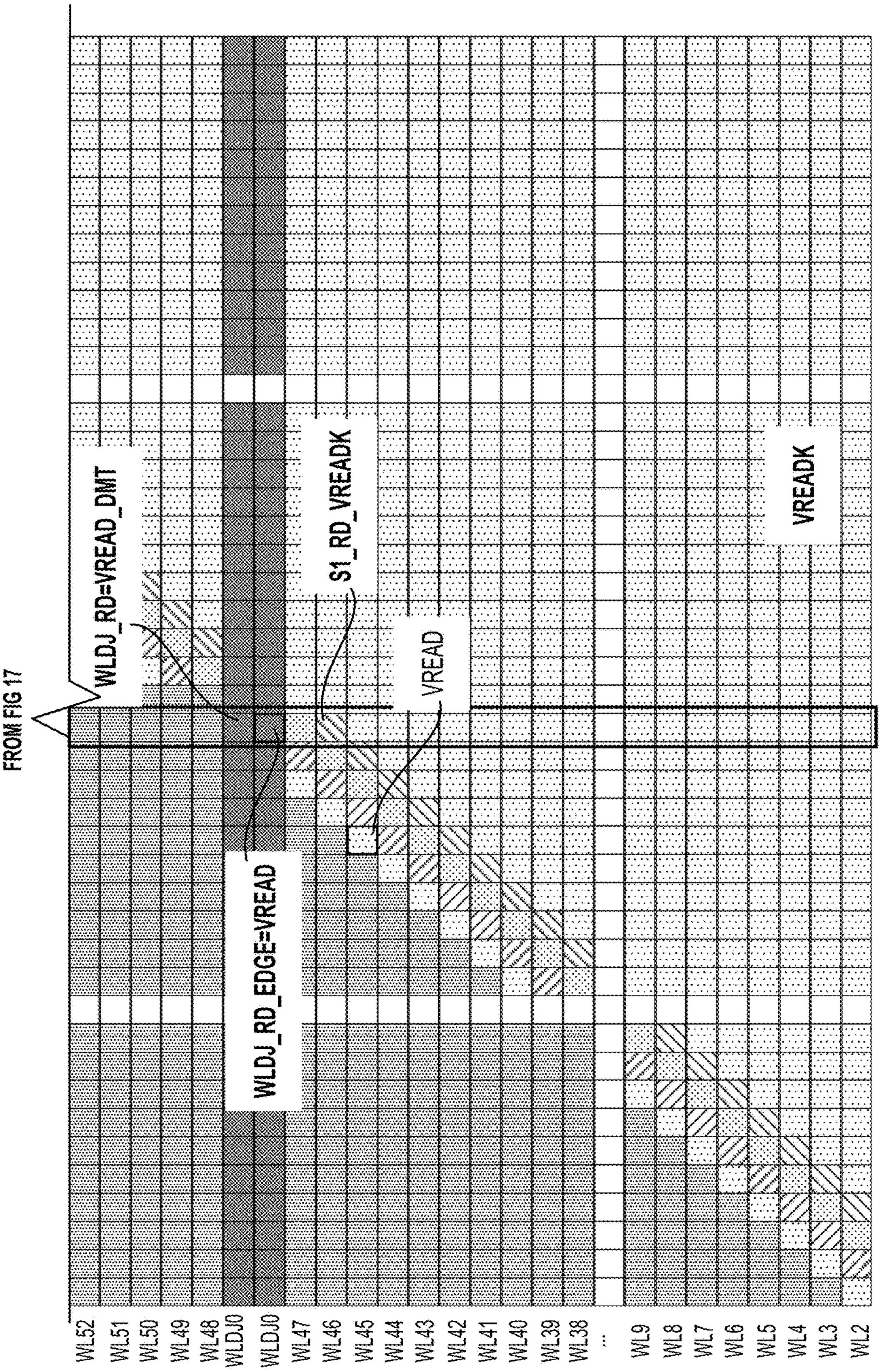

When strings or memory holes of the memory cells extend through a stack (e.g., stack 610 of FIG. 6B), at least one word line is not adjacent to a data word line on one side. For example, in FIG. 6B, WLL0 is adjacent to a dummy word line layer DWLS1. Such a word line is known as an edge word line. When the stack is arranged as to have two tiers (an upper memory hole (UMH) and lower memory hole (LMH) disposed vertically below the upper memory hole), such edge word lines may be located near a joint vertically between the UMH and LMH (i.e., the bottom of the upper memory hole), as well as the bottom of the stack (i.e., the bottom of the lower memory hole). The edge word line does not have a neighboring data word line, so it intrinsically has less NWI (neighbor word line interference). FIG. 15 is a plot of median threshold voltage Vt margin versus physical word line for various temperatures. As shown, the edge word line WL80 has 250~400 a.u. more margin than the word line immediately above it in the stack (word line WL 79) (bottleneck). FIG. 16 is a plot of average delta threshold voltage Vt versus physical word line for various amounts of program erase cycling of the memory apparatus. The edge word line WL80 has 600~800 a.u. better data retention loss than the word line immediately above it in the stack (word line WL 79). FIG. 17 shows a diagram of a memory apparatus including a stack comprising two tiers including an upper tier (including WL48-WL95) arranged vertically above a lower tier (including WL2-WL47) and indicating voltage levels applied to the word lines during a program operation using VPVD. So, as discussed above, when VPVD is enabled in for quad-level memory cells (those each storing four bits) with foggy-fine (FF) programming, at the memory hole joint, VPVD will be applied on word line with foggy data and that causes issues. Specifically, in FIG. 17, when program-verifying WL47, the following biases may be applied: WL48: VPVD, WLDU0: VREAD_DMT, WLDL0: VREAD, WL47: VCGV, WL48: VREADK. When verifying WL47, WL48 is in foggy and is biased at VPVD, therefore, low VPVD will be an issue. Additional parameters may be needed when coming to joint word lines with VPVD.

Consequently, described herein is a memory apparatus (e.g., memory device 100 of FIG. 1A) including memory cells (e.g., data memory cell MC and dummy memory cells 682, 683 of FIG. 6D) each connected to one of a plurality of word lines (e.g., word line layers WLL0-WLL10 of FIG. 6B) and disposed in memory holes (e.g., memory holes 618 and 619 of FIG. 6B). The memory cells are configured to retain a threshold voltage corresponding to one of a plurality of data states (e.g., erase Er data state and S1-S7 data states of FIG. 9). The memory apparatus also includes a control circuit or means (e.g., one or any combination of control circuitry 110, decoders 114/132, power control module 116, sense blocks SBb, SB2, . . . , SBp, read/write circuits 128, controller 122 of FIG. 1A, control circuit 150 of FIG. 1B, and/or sense circuit controller 560 of FIG. 5 and so forth) coupled to the plurality of word lines and the memory holes. The control means is configured to program the memory cells in a program operation. During the program operation, the control means is also configured to program the memory cells connected to at least one particular word line of the plurality of word lines using a first programming technique while programming the memory cells connected to plurality of word lines other than the at least one particular word line using a second programming technique different than the first programming technique. According to an aspect, the memory cells are quad-level memory cells QLC/X4) each configured to store four bits and the plurality of data states includes an erased state and fifteen programmed data states (seven programmed data states S8-S15 in addition to those shown in FIG. 9).

Referring back to FIG. 6B, for example, the plurality of word lines (e.g., word line layers (word lines) WLL0-WLL10) and a plurality of dielectric layers (e.g., DL0-DL19) extend horizontally and overlay one another in an alternating fashion in a stack (e.g., stack 616). The memory holes (e.g., NAND strings NS1 and NS2) extend vertically through the stack. The memory cells are connected in series between a drain-side select gate SGD transistor (e.g., at SGD0 or SGD1 layers) on a drain-side of each of the plurality of memory holes and a source-side select gate transistor (e.g., at SGS0 or SGS1 layers) on a source-side of each of the plurality of memory holes. The drain-side select gate SGD transistor of each of the plurality of memory holes is connected to one of the plurality of bit lines (e.g., BL0) and the source-side select gate transistor of each of the plurality of memory holes is connected to a source line (e.g., SL). Referring back to FIG. 17, for example, the stack can comprise two tiers with an upper tier (e.g., WL48-WL95) arranged vertically above a lower tier (e.g., WL2-WL47). The at least one particular word line is at least one edge word line comprising at least one of the plurality of word lines at a bottom of the upper tier (e.g., WL48) and at a bottom of the lower tier (e.g., WL2). The plurality of word lines also includes at least one neighbor word line (e.g., WL49) disposed vertically above and adjacent the at least one edge word line.

According to an aspect, the first programming technique is a full sequence programming technique. Such a full sequence program technique is described in U.S. Pat. No. 7,839,687, "Multi-Pass Programming for Memory Using Word Line Coupling," which is hereby incorporated by reference herein in its entirety. The plurality of data states include, in order of increasing threshold voltage, an erased state and a plurality of programmed data states (e.g., S1-S7 data states of FIG. 9). The control means is further configured to program the memory cells connected to the at least one particular word line from the erased state directly to the plurality of data states targeted for each of the memory cells. Such a full sequence program technique for quad-level memory cell edge word lines programming helps achieve better performance.

While the full sequence program technique may be carried out with only one programming pulse, multiple pulses may be used instead. So, according to another aspect, the control means is configured to program the memory cells connected to the at least one particular word line to the plurality of data states targeted for each of the memory cells by applying a plurality of pulses increasing in magnitude by a step amount to connected to the at least one particular word line connected to the memory cells during each of a plurality of programming loops of the full sequence programming technique.

Thus, according to an aspect, the second programming technique is a foggy-fine programming technique. Such a foggy-fine program technique is described in U.S. Pat. No. 7,839,687, "Multi-Pass Programming for Memory Using Word Line Coupling," which is hereby incorporated by reference herein in its entirety. Again, the plurality of data states include, in order of the threshold voltage increasing, an erased state and a plurality of programmed data states. So, the control means is further configured to program each of the memory cells connected to the plurality of word lines other than the at least one particular word line targeted for one of the plurality of programmed data states to one of a plurality of lower programmed data states corresponding with the one of the plurality of programmed data states targeted while each of the memory cells connected to the plurality of word lines other than the at least one particular word line targeted for the erased state remains in the erased state in a first programming pass. Each of the plurality of lower programmed data states is associated with the threshold voltage being lower than a corresponding one of the plurality of programmed data states. The control means is additionally configured to program each of the memory cells connected to the plurality of word lines other than the at least one particular word line programmed to the plurality of lower programmed data states to corresponding ones of the plurality of programmed data states targeted while each of the memory cells connected to the plurality of word lines other than the at least one particular word line targeted for the erased state remains in the erased state in a second programming pass.

Figure 18:
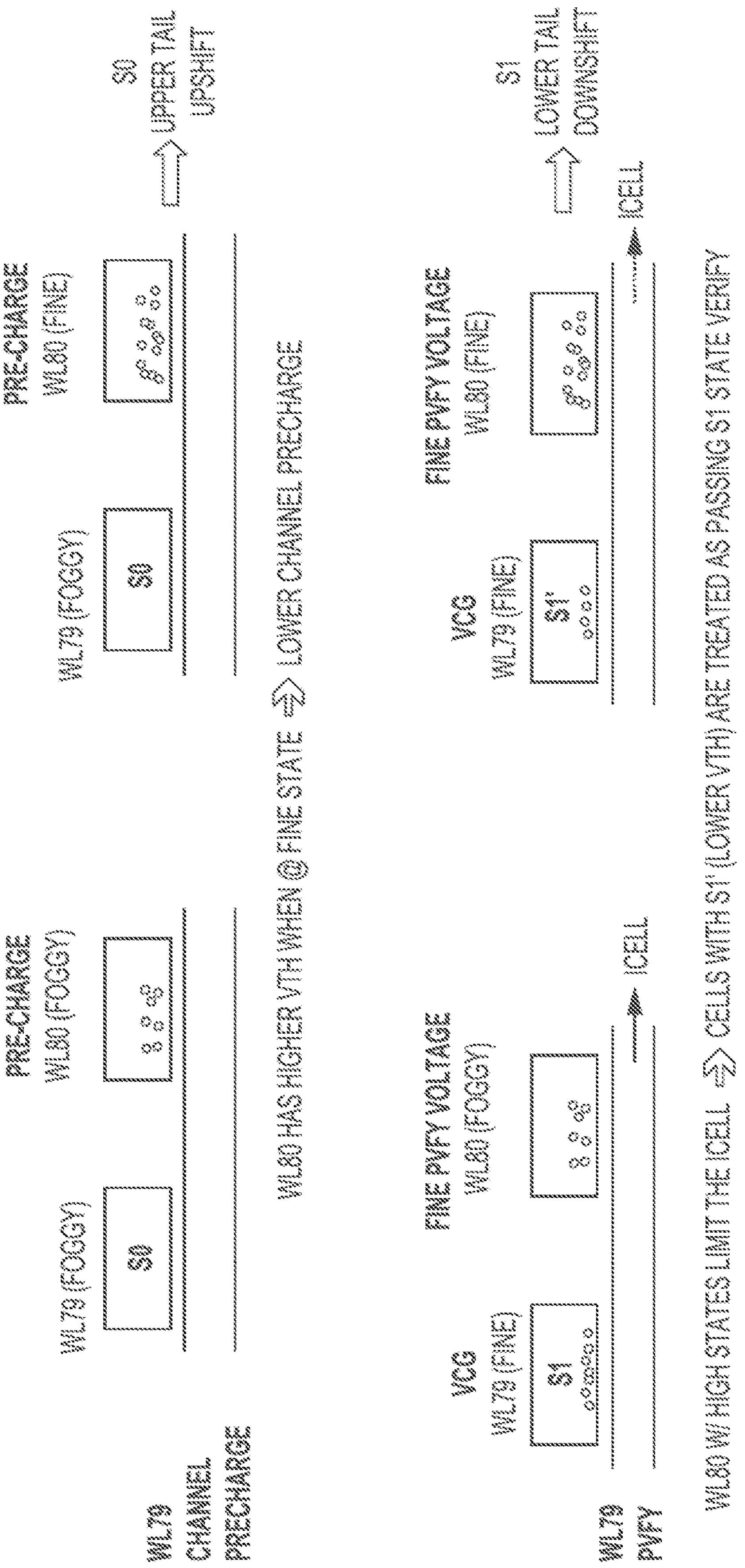
FIG. 18 shows a model of voltages and current occurring during a pre-charge of a word line neighboring an edge word line and a program-verify of the word line neighboring the edge word line according to aspects of the disclosure.

FIG. 18 shows a model of voltages and current occurring during a pre-charge of a word line (e.g., WL79) neighboring an edge word line (e.g., WL80) and a program-verify (PVFY) of the word line neighboring the edge word line. While full sequence program is enabled on the edge word line WL80, the following approaches can improve the performance of the neighboring word line WL79. Increasing WL80 bias during WL79 channel pre-charge helps boosting channel, resulting in less S0 data state upshift during WL79 program. Increasing WL80 bias during WL79 PVFY of lower data states prevents the lower tail downshift of the lower data states. Thus, according to an aspect, the control means is further configured to apply programming pulses to the at least one neighbor word line to program the memory cells connected to the at least one neighbor word line to one of the plurality of data states during the program operation. The control means is also configured to apply a verify voltage associated with the one of the plurality of data states to the at least one neighbor word line to verify the memory cells being programmed during the program operation. In addition, the control means is configured to adjust one or more parameters affecting voltages applied to the at least one edge word line while verifying the memory cells connected to the at least one neighbor word line being programmed during the program operation.

FIG. 19 is a table of the foggy-fine states, average time and average program loops using a foggy-fine program technique, a full sequence program technique in which the edge word line is programmed directly to fine, along with a difference between the two techniques for multiple word lines. So, as shown, for the edge word line WL80, with no foggy step, a penalty of 1.6 loops (445 a.u.) is incurred for the full sequence program technique. However, overall 1900 a.u. (15.4%) savings of program time Tprog for the edge word line WL80 is realized.

Figure 20A:
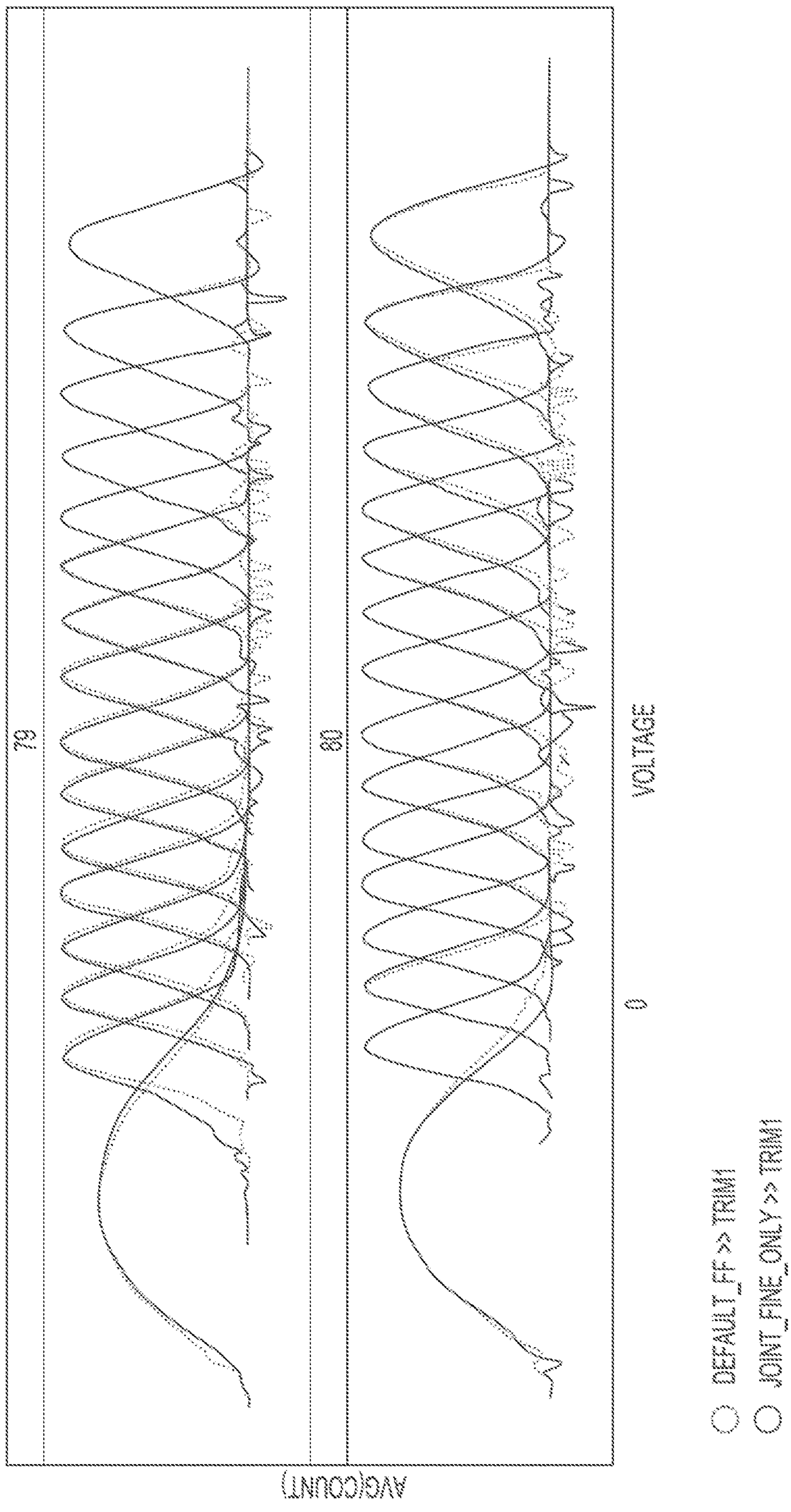
FIG. 20A shows threshold voltage distributions of quad-level memory cells with and without the full sequence program technique for the edge word line without changing parameters affecting voltages applied to the edge word line and the neighbor word line during pre-charge and verifying the memory cells according to aspects of the disclosure.
Figure 20B:
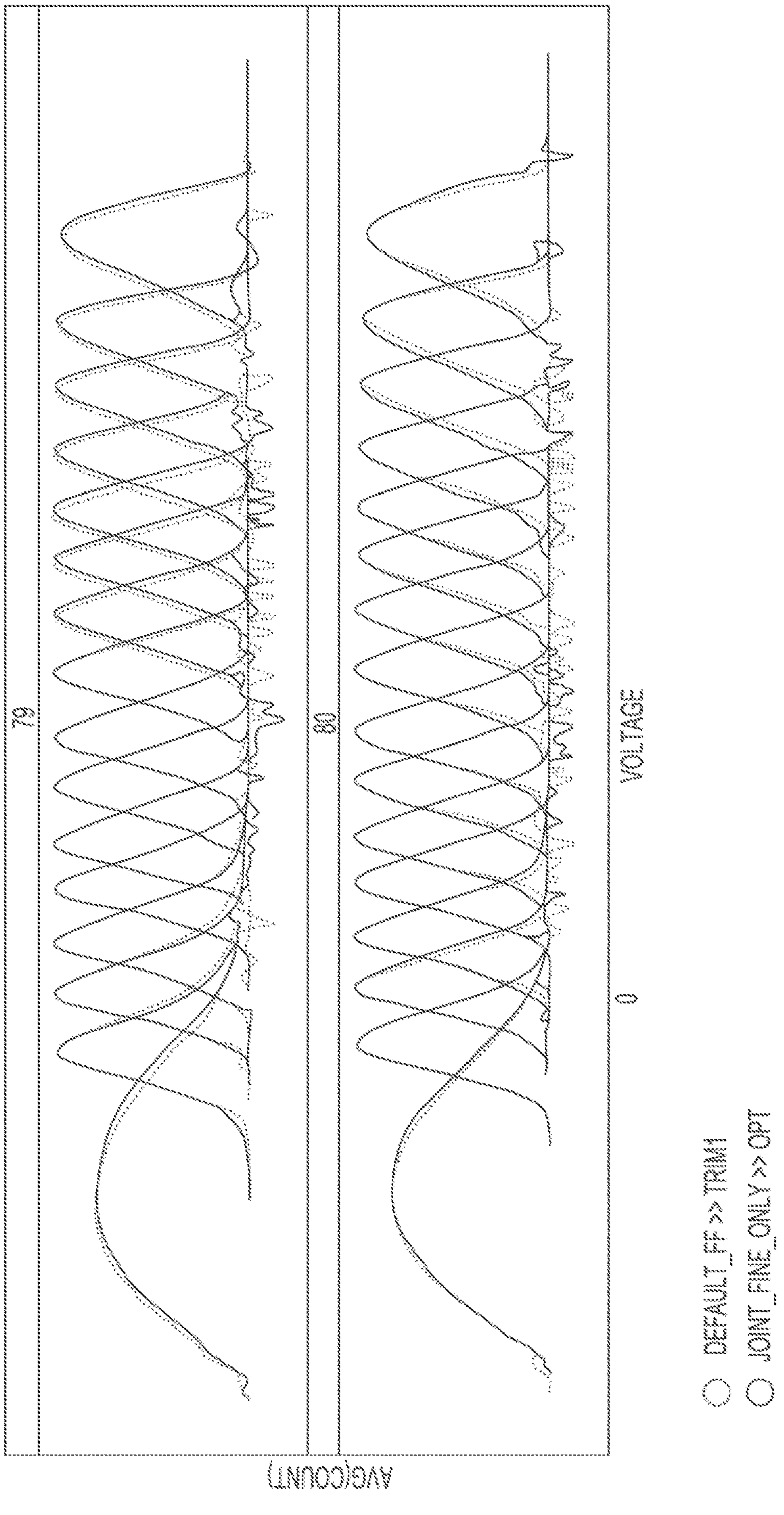
FIG. 20B shows threshold voltage distributions of quad-level memory cells with and without the full sequence program technique for the edge word line with changed parameters affecting voltages applied to the edge word line while verifying the memory cells connected to the neighbor word line being programmed according to aspects of the disclosure.

FIG. 20A shows threshold voltage distributions of quad-level memory cells with and without the full sequence program technique for the edge word line WL80 without changing parameters affecting voltages applied to the edge word line WL80 and the neighbor word line WL79 during pre-charge and verifying the memory cells (i.e., using the original trim). There is a 65 a.u. penalty for the neighbor word line WL79. In contrast, FIG. 20B shows threshold voltage distributions of quad-level memory cells with and without the full sequence program technique for the edge word line WL80 with changed parameters affecting voltages applied to the edge word line WL80 while the neighbor word line WL79 during pre-charge and verifying the memory cells (i.e., the OPT trim). There is a 162 a.u. benefit for the neighbor word line WL79.

FIG. 21 is a table of an S0 data state upper tail, S1-S14 data states, a S15 data state lower tail, and threshold voltage Vt window using the foggy-fine program technique, the full sequence program technique in which the edge word line is programmed directly to fine, along with the difference between the two techniques for the edge word line WL80 and neighboring word line WL79 with two different trims (TRIM1 and OPT). Using a voltage of 5.4 a.u on WL80 during WL79 pre-charge and a voltage of 7.2 a.u on WL80 during WL79 PVFY. (TRIM1 or the base/original trim), there is a 65 a.u. threshold voltage Vt window penalty for the neighbor word line WL79 and a 389 a.u. threshold voltage Vt window penalty for the edge word line. In contrast, using a voltage of 7.4 a.u on WL80 during WL79 pre-charge. and a voltage of 7.5 a.u. (OPT trim) on WL80 of WL79 PVFY, there is a 162 a.u. threshold voltage Vt window benefit for the neighbor word line WL79 and a 410 a.u. threshold voltage Vt window penalty for the edge word line. FIG. 22 is a table of a margin change for the edge word line WL 80 and neighboring word line WL79 using various pre-charge voltages and PVFY voltages (listed as TRIM1, TRIM2, TRIM3, and TRIM4). As shown, more margin gain can be achieved with parameter fine tuning.

FIG. 23 is a table of a threshold voltage Vt window using the foggy-fine program technique and the full sequence program technique in which the edge word line is programmed directly to fine for various word lines after high temperature data retention (HTDR) with two different trims. Specifically, for the original trim (i.e., TRIM1), a pre-charge voltage of 5.4 a.u. and a PVFY voltage of 7.2 a.u. are used. For the OPT trim, a pre-charge voltage of 7.4 a.u. and a PVFY voltage of 7.6 a.u. are used. The data retention margin of the edge word line WL80 at 16 hours is not the bottleneck (is approximately 50 a.u. better than WL78).

FIG. 24 shows a plot of a threshold voltage of memory cells for the S0 data state along with two portions in detail for various pre-charge voltages applied to the edge word line WL80 during the neighboring word line pre-charge. FIG. 25 is a table of the state width of the S0 data state using the foggy-fine program technique and the full sequence program technique for the neighboring word line with various pre-charge voltages applied to the edge word line WL80 during the neighboring word line WL79 pre-charge. Increasing the pre-charge voltage applied to the edge word line WL80 during the neighboring word line pre-charge lowers the S0 data state upper tail.

FIG. 26 shows a plot of a threshold voltage of memory cells for the multiple data states for various PVFY voltages applied to the edge word line WL80 during the neighboring word line WL79 program-verify. FIG. 27 is a table of the state width of the plurality of data states using the foggy-fine program technique and the full sequence program technique for the neighboring word line with various PVFY voltages applied to the edge word line WL80 during the neighboring word line WL79 program-verify. As shown, increasing the PVFY voltage biasing the edge word line during the neighboring word line WL79 program-verify effectively prevent low states lower tail down shift. So, according to aspects of the disclosure, the one or more parameters affecting voltages applied to the at least one edge word line while verifying the memory cells connected to the at least one neighbor word line can include the PVFY voltage applied to the edge word line WL80 during the neighboring word line WL79 program-verify and the pre-charge voltages applied to the edge word line WL80 during the neighboring word line WL79 pre-charge.

FIG. 28 is a table of program disturb (PD) and data retention (DR) for multiple word lines using the foggy-fine program technique and the full sequence program technique in which the edge word line is programmed directly to fine along with the tuning or adjusting the parameters affecting voltages applied to the at least one edge word line WL80 as described above (e.g., the pre-charge voltage and the PVFY voltage). So, the benefits of the edge word line full sequence program technique along with the tuning or adjusting the parameters affecting voltages applied to the at least one edge word line WL80 as described herein provide a program time Tprog reduction for those word lines. A system cache savings during the programing of those word lines is also realized. This scheme is also compatible with VPVD mode. Neighboring word line interference (NWI) on the neighboring word line WL79 (current bottleneck) is reduced by one time (1×). Combined with parameter tuning during the neighboring word line WL79 fine program, the program disturb margin of the neighboring word line WL79 is improved by 160~190 a.u. In addition, the neighboring word line WL79 threshold voltage Vt margin gain is improved. Data states S4-S15 get tightened due to less NWI and the S0 data state upper tail upshift and S1-S3 lower tail down shift can be recovered by increasing bias on the edge word line WL80 during the neighboring word line WL79 fine step channel pre-charge and program-verify. The edge word line WL80 data retention margin (16 hr@85 C) is still 25~50 a.u. better than neighbor word lines.

FIG. 29 illustrates steps of a method of operating a memory apparatus. As discussed above, the memory apparatus (e.g., memory device 100 of FIG. 1A) includes memory cells (e.g., data memory cell MC and dummy memory cells 682, 683 of FIG. 6D) each connected to one of a plurality of word lines (e.g., word line layers WLL0-WLL10 of FIG. 6B) and disposed in memory holes (e.g., memory holes 618 and 619 of FIG. 6B). The memory cells are configured to retain a threshold voltage corresponding to one of a plurality of data states (e.g., erase Er data state and S1-S7 data states of FIG. 9). The method includes the step of 2900 programming the memory cells in a program operation. The method continues with the step of 2902 during the program operation, programming the memory cells connected to at least one particular word line of the plurality of word lines using a first programming technique while programming the memory cells connected to plurality of word lines other than the at least one particular word line using a second programming technique different than the first programming technique. Again, according to an aspect, the memory cells are quad-level memory cells QLC/X4) each configured to store four bits and the plurality of data states includes an erased state and fifteen programmed data states (seven programmed data states S8-S15 in addition to those shown in FIG. 9).

As above, referring back to FIG. 6B, for example, the plurality of word lines (e.g., word line layers (word lines) WLL0-WLL10) and a plurality of dielectric layers (e.g., DL0-DL19) extend horizontally and overlay one another in an alternating fashion in a stack (e.g., stack 616). The memory holes (e.g., NAND strings NS1 and NS2) extend vertically through the stack. The memory cells are connected in series between a drain-side select gate SGD transistor (e.g., at SGD0 or SGD1 layers) on a drain-side of each of the plurality of memory holes and a source-side select gate transistor (e.g., at SGS0 or SGS1 layers) on a source-side of each of the plurality of memory holes. The drain-side select gate SGD transistor of each of the plurality of memory holes is connected to one of the plurality of bit lines (e.g., BL0) and the source-side select gate transistor of each of the plurality of memory holes is connected to a source line (e.g., SL). Referring back to FIG. 17, for example, the stack can comprise two tiers with an upper tier (e.g., WL48-WL95) arranged vertically above a lower tier (e.g., WL2-WL47). The at least one particular word line is at least one edge word line comprising at least one of the plurality of word lines at a bottom of the upper tier (e.g., WL48) and at a bottom of the lower tier (e.g., WL2). The plurality of word lines also includes at least one neighbor word line (e.g., WL49) disposed vertically above and adjacent the at least one edge word line.

As discussed, tuning parameters used during the neighboring word line WL79 fine program can improve the program disturb margin of the neighboring word line WL79, the neighboring word line WL79 threshold voltage Vt margin gain, data states and tightness of S4-S15 data states Thus, according to an aspect, the method further includes the step of applying programming pulses to the at least one neighbor word line to program the memory cells connected to the at least one neighbor word line to one of the plurality of data states during the program operation. Next, applying a verify voltage associated with the one of the plurality of data states to the at least one neighbor word line to verify the memory cells being programmed during the program operation. The method also includes the step of adjusting one or more parameters affecting voltages applied to the at least one edge word line while verifying the memory cells connected to the at least one neighbor word line being programmed during the program operation.

Again, according to an aspect, the first programming technique is a full sequence programming technique. The plurality of data states include, in order of increasing threshold voltage, an erased state and a plurality of programmed data states (e.g., S1-S7 data states of FIG. 9). The method further includes the step of programming the memory cells connected to the at least one particular word line from the erased state directly to the plurality of data states targeted for each of the memory cells.

As above, the full sequence program technique may be carried out with only one programming pulse, however, multiple pulses may be used instead. Thus, according to another aspect, the method includes the step of programming the memory cells connected to the at least one particular word line to the plurality of data states targeted for each of the memory cells by applying a plurality of pulses increasing in magnitude by a step amount to connected to the at least one particular word line connected to the memory cells during each of a plurality of programming loops of the full sequence programming technique.

Again, word lines other than the at least one particular word line may be programmed using another technique different than full sequence. So, according to an aspect, the second programming technique is a foggy-fine programming technique and the method further includes the step of programming each of the memory cells connected to the plurality of word lines other than the at least one particular word line targeted for one of the plurality of programmed data states to one of a plurality of lower programmed data states corresponding with the one of the plurality of programmed data states targeted while each of the memory cells connected to the plurality of word lines other than the at least one particular word line targeted for the erased state remains in the erased state in a first programming pass. Each of the plurality of lower programmed data states is associated with the threshold voltage being lower than a corresponding one of the plurality of programmed data states. The method also includes the step of programming each of the memory cells connected to the plurality of word lines other than the at least one particular word line programmed to the plurality of lower programmed data states to corresponding ones of the plurality of programmed data states targeted while each of the memory cells connected to the plurality of word lines other than the at least one particular word line targeted for the erased state remains in the erased state in a second programming pass.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term “component” may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term “circuit” is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a “controller” shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms “program,” “software,” “software application,” and the like as may be used herein, refer to a sequence of instructions that is designed for execution on a computer-implemented system. Accordingly, a “program,” “software,” “application,” “computer program,” or “software application” may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms “couple,” “coupled,” or “couples,” where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as “an embodiment,” “one embodiment,” an “exemplary embodiment,” a “particular embodiment,” or other similar terminology, these terms are intended to indicate that a specific feature, structure, function, operation, or characteristic described in connection with the embodiment is found in at least one embodiment of the present disclosure. Therefore, the appearances of phrases such as “in one embodiment,” “in an embodiment,” “in an exemplary embodiment,” etc., may, but do not necessarily, all refer to the same embodiment, but rather, mean “one or more but not all embodiments” unless expressly specified otherwise. Further, the terms “comprising,” “having,” “including,” and variations thereof, are used in an open-ended manner and, therefore, should be interpreted to mean “including, but not limited to . . . ” unless expressly specified otherwise. Also, an element that is preceded by “comprises . . . a” does not, without more constraints, preclude the existence of additional identical elements in the subject process, method, system, article, or apparatus that includes the element.

The terms “a,” “an,” and “the” also refer to “one or more” unless expressly specified otherwise. In addition, the phrase “at least one of A and B” as may be used herein and/or in the following claims, whereby A and B are variables indicating a particular object or attribute, indicates a choice of A or B, or both A and B, similar to the phrase “and/or.” Where more than two variables are present in such a phrase, this phrase is hereby defined as including only one of the variables, any one of the variables, any combination (or sub-combination) of any of the variables, and all of the variables.

Further, where used herein, the term “about” or “approximately” applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A memory apparatus, comprising:

memory cells each connected to one of a plurality of word lines and disposed in memory holes, the memory cells configured to retain a threshold voltage corresponding to one of a plurality of data states; and a control means coupled to the plurality of word lines and the memory holes and configured to:

program the memory cells in a program operation, and during the program operation, program the memory cells connected to at least one particular word line of the plurality of word lines using a first programming technique, wherein the first programming technique is a full sequence programming technique, while, in the same program operation, programming the memory cells connected to a plurality of word lines other than the at least one particular word line using a second programming technique different than the first programming technique, wherein the second programming technique is a foggy-fine programming technique, and wherein the programming of the memory cells connected to the at least one particular word line of the plurality of word lines using the first programming technique is performed during the programming of the memory cells connected to the plurality of word lines other than the at least one particular word line using the second programming technique.

2. The memory apparatus as set forth in claim 1, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of a plurality of bit lines and the source-side select gate transistor of each of the memory holes is connected to a source line, the stack comprising two tiers with an upper tier arranged vertically above a lower tier, the at least one particular word line is at least one edge word line comprising at least one of the plurality of word lines at a bottom of the upper tier and at a bottom of the lower tier, the plurality of word lines including at least one neighbor word line disposed vertically above and adjacent the at least one edge word line.

3. The memory apparatus as set forth in claim 2, wherein the control means is further configured to:

apply programming pulses to the at least one neighbor word line to program the memory cells connected to the at least one neighbor word line to one of the plurality of data states during the program operation;

apply a verify voltage associated with the one of the plurality of data states to the at least one neighbor word line to verify the memory cells being programmed during the program operation; and adjust one or more parameters affecting voltages applied to the at least one edge word line while verifying the memory cells connected to the at least one neighbor word line being programmed during the program operation.

4. The memory apparatus as set forth in claim 1, wherein the plurality of data states include, in order of increasing threshold voltage, an erased state and a plurality of programmed data states, and the control means is further configured to program the memory cells connected to the at least one particular word line from the erased state directly to the plurality of data states targeted for each of the memory cells.

5. The memory apparatus as set forth in claim 4, wherein the control means is configured to program the memory cells connected to the at least one particular word line to the plurality of data states targeted for each of the memory cells by applying a plurality of pulses increasing in magnitude by a step amount to connected to the at least one particular word line connected to the memory cells during each of a plurality of programming loops of the full sequence programming technique.

6. The memory apparatus as set forth in claim 4, wherein the plurality of data states include, in order of the threshold voltage increasing, an erased state and a plurality of programmed data states, and the control means is further configured to:

program each of the memory cells connected to the plurality of word lines other than the at least one particular word line targeted for one of the plurality of programmed data states to one of a plurality of lower programmed data states corresponding with the one of the plurality of programmed data states targeted while each of the memory cells connected to the plurality of word lines other than the at least one particular word line targeted for the erased state remains in the erased state in a first programming pass, each of the plurality of lower programmed data states being associated with the threshold voltage being lower than a corresponding one of the plurality of programmed data states; and program each of the memory cells connected to the plurality of word lines other than the at least one particular word line programmed to the plurality of lower programmed data states to corresponding ones of the plurality of programmed data states targeted while each of the memory cells connected to the plurality of word lines other than the at least one particular word line targeted for the erased state remains in the erased state in a second programming pass.

7. The memory apparatus as set forth in claim 1, wherein the memory cells are quad-level memory cells, each configured to store four bits, and the plurality of data states includes an erased state and fifteen programmed data states.

8. A controller in communication with a memory apparatus including memory cells each connected to one of a plurality of word lines and disposed in memory holes, the memory cells configured to retain a threshold voltage corresponding to one of a plurality of data states, the controller configured to:

instruct the memory apparatus to program the memory cells in a program operation; and during the program operation, instruct the memory apparatus to program the memory cells connected to at least one particular word line of the plurality of word lines using a first programming technique, wherein the first programming technique is a full sequence programming technique, while, in the same program operation, programming the memory cells connected to a plurality of word lines other than the at least one particular word line using a second programming technique different than the first programming technique, wherein the second programming technique is a foggy-fine programming technique, and wherein the programming of the memory cells connected to the at least one particular word line of the plurality of word lines using the first programming technique is performed during the programming of the memory cells connected to the plurality of word lines other than the at least one particular word line using the second programming technique.

9. The controller as set forth in claim 8, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of a plurality of bit lines and the source-side select gate transistor of each of the memory holes is connected to a source line, the stack comprising two tiers with an upper tier arranged vertically above a lower tier, the at least one particular word line is at least one edge word line comprising at least one of the plurality of word lines at a bottom of the upper tier and at a bottom of the lower tier, the plurality of word lines including at least one neighbor word line disposed vertically above and adjacent the at least one edge word line.

10. The controller as set forth in claim 9, wherein the controller is further configured to:

instruct the memory apparatus to apply programming pulses to the at least one neighbor word line to program the memory cells connected to the at least one neighbor word line to one of the plurality of data states during the program operation;

instruct the memory apparatus to apply a verify voltage associated with the one of the plurality of data states to the at least one neighbor word line to verify the memory cells being programmed during the program operation; and adjust one or more parameters affecting voltages applied to the at least one edge word line while verifying the memory cells connected to the at least one neighbor word line being programmed during the program operation.

11. The controller as set forth in claim 8, wherein the plurality of data states include, in order of increasing threshold voltage, an erased state and a plurality of programmed data states, and the controller is further configured to instruct the memory apparatus to program the memory cells connected to the at least one particular word line from the erased state directly to the plurality of data states targeted for each of the memory cells.

12. The controller as set forth in claim 11, wherein the controller is configured to instruct the memory apparatus to program the memory cells connected to the at least one particular word line to the plurality of data states targeted for each of the memory cells by applying a plurality of pulses increasing in magnitude by a step amount to connected to the at least one particular word line connected to the memory cells during each of a plurality of programming loops of the full sequence programming technique.

13. The controller as set forth in claim 11, wherein the plurality of data states include, in order of the threshold voltage increasing, an erased state and a plurality of programmed data states, and the controller is further configured to:

instruct the memory apparatus to program each of the memory cells connected to the plurality of word lines other than the at least one particular word line targeted for one of the plurality of programmed data states to one of a plurality of lower programmed data states corresponding with the one of the plurality of programmed data states targeted while each of the memory cells connected to the plurality of word lines other than the at least one particular word line targeted for the erased state remains in the erased state in a first programming pass, each of the plurality of lower programmed data states being associated with the threshold voltage being lower than a corresponding one of the plurality of programmed data states; and instruct the memory apparatus to program each of the memory cells connected to the plurality of word lines other than the at least one particular word line programmed to the plurality of lower programmed data states to corresponding ones of the plurality of programmed data states targeted while each of the memory cells connected to the plurality of word lines other than the at least one particular word line targeted for the erased state remains in the erased state in a second programming pass.

14. A method of operating a memory apparatus including memory cells each connected to one of a plurality of word lines and disposed in memory holes, the memory cells configured to retain a threshold voltage corresponding to one of a plurality of data states, the method comprising the steps of:

programming the memory cells in a program operation; and during the program operation, programming the memory cells connected to at least one particular word line of the plurality of word lines using a first programming technique, wherein the first programming technique is a full sequence programming technique, while, in the same program operation programming the memory cells connected to a plurality of word lines other than the at least one particular word line using a second programming technique different than the first programming technique, wherein the second programming technique is a foggy-fine programming technique, and wherein the programming of the memory cells connected to the at least one particular word line of the plurality of word lines using the first programming technique is performed during the programming of the memory cells connected to the plurality of word lines other than the at least one particular word line using the second programming technique.

15. The method as set forth in claim 14, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain- side select gate transistor of each of the memory holes is connected to one of a plurality of bit lines and the source-side select gate transistor of each of the memory holes is connected to a source line, the stack comprising two tiers with an upper tier arranged vertically above a lower tier, the at least one particular word line is at least one edge word line comprising at least one of the plurality of word lines at a bottom of the upper tier and at a bottom of the lower tier, the plurality of word lines including at least one neighbor word line disposed vertically above and adjacent the at least one edge word line.

16. The method as set forth in claim 15, further including the steps of:

applying programming pulses to the at least one neighbor word line to program the memory cells connected to the at least one neighbor word line to one of the plurality of data states during the program operation;

applying a verify voltage associated with the one of the plurality of data states to the at least one neighbor word line to verify the memory cells being programmed during the program operation; and adjusting one or more parameters affecting voltages applied to the at least one edge word line while verifying the memory cells connected to the at least one neighbor word line being programmed during the program operation.

17. The method as set forth in claim 14, wherein the plurality of data states include, in order of increasing threshold voltage, an erased state and a plurality of programmed data states, and the method further includes the step of programming the memory cells connected to the at least one particular word line from the erased state directly to the plurality of data states targeted for each of the memory cells.

18. The method as set forth in claim 17, further including the step of programming the memory cells connected to the at least one particular word line to the plurality of data states targeted for each of the memory cells by applying a plurality of pulses increasing in magnitude by a step amount to connected to the at least one particular word line connected to the memory cells during each of a plurality of programming loops of the full sequence programming technique.

19. The method as set forth in claim 17, wherein the plurality of data states include, in order of the threshold voltage increasing, an erased state and a plurality of programmed data states, and the method further includes the step of:

programming each of the memory cells connected to the plurality of word lines other than the at least one particular word line targeted for one of the plurality of programmed data states to one of a plurality of lower programmed data states corresponding with the one of the plurality of programmed data states targeted while each of the memory cells connected to the plurality of word lines other than the at least one particular word line targeted for the erased state remains in the erased state in a first programming pass, each of the plurality of lower programmed data states being associated with the threshold voltage being lower than a corresponding one of the plurality of programmed data states; and programming each of the memory cells connected to the plurality of word lines other than the at least one particular word line programmed to the plurality of lower programmed data states to corresponding ones of the plurality of programmed data states targeted while each of the memory cells connected to the plurality of word lines other than the at least one particular word line targeted for the erased state remains in the erased state in a second programming pass.

20. The method as set forth in claim 14, wherein the memory cells are quad-level memory cells, each configured to store four bits, and the plurality of data states includes an erased state and fifteen programmed data states.

* * * * *